(12) United States Patent
Leung et al.

(10) Patent No.: US 9,093,616 B2
(45) Date of Patent: *Jul. 28, 2015

(54) MOLDED CHIP FABRICATION METHOD AND APPARATUS

(75) Inventors: Michael S. Leung, Goleta, CA (US); Eric J. Tarsa, Goleta, CA (US); James Ibbetson, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/072,371

(22) Filed: Mar. 25, 2011

(65) Prior Publication Data

US 2011/0169038 A1 Jul. 14, 2011

Related U.S. Application Data

(63) Continuation of application No. 10/666,399, filed on Sep. 18, 2003, now Pat. No. 7,915,085.

(51) Int. Cl.
*H01L 33/44* (2010.01)
*H01L 33/50* (2010.01)
(Continued)

(52) U.S. Cl.
CPC ............ *H01L 33/504* (2013.01); *H01L 21/565* (2013.01); *H01L 24/96* (2013.01);
(Continued)

(58) Field of Classification Search
USPC ................ 257/79, 13, 80–103, 918, E51.018, 257/E51.019, E51.022, E25.028
See application file for complete search history.

(56) References Cited

U.S. PATENT DOCUMENTS

| 4,576,796 | A | 3/1986 | McCormick |
| 4,733,335 | A | 3/1988 | Serizawa et al. ............. 362/503 |

(Continued)

FOREIGN PATENT DOCUMENTS

| CN | 2310925 | 3/1999 |
| CN | 1455960 | 11/2003 |

(Continued)

OTHER PUBLICATIONS

Lau, John, "Flip-Chip Technologies", McGraw Hill, 1996.
(Continued)

*Primary Examiner* — Marc Armand
(74) *Attorney, Agent, or Firm* — Koppel, Patrick, Heybl & Philpott

(57) ABSTRACT

A method and apparatus for coating a plurality of semiconductor devices that is particularly adapted to coating LEDs with a coating material containing conversion particles. One method according to the invention comprises providing a mold with a formation cavity. A plurality of semiconductor devices are mounted within the mold formation cavity and a curable coating material is injected or otherwise introduced into the mold to fill the mold formation cavity and at least partially cover the semiconductor devices. The coating material is cured so that the semiconductor devices are at least partially embedded in the cured coating material. The cured coating material with the embedded semiconductor devices is removed from the formation cavity. The semiconductor devices are separated so that each is at least partially covered by a layer of the cured coating material. One embodiment of an apparatus according to the invention for coating a plurality of semiconductor devices comprises a mold housing having a formation cavity arranged to hold semiconductor devices. The formation cavity is also arranged so that a curable coating material can be injected into and fills the formation cavity to at least partially covering the semiconductor devices.

26 Claims, 11 Drawing Sheets

(51) Int. Cl.
*H01L 21/56* (2006.01)
*H01L 23/00* (2006.01)
*H01L 27/15* (2006.01)

(52) U.S. Cl.
CPC .............. *H01L 27/15* (2013.01); *H01L 33/50* (2013.01); *H01L 2924/12041* (2013.01); *H01L 2924/1815* (2013.01); *H01L 2933/0041* (2013.01)

(56) References Cited

U.S. PATENT DOCUMENTS

| | | | | |
|---|---|---|---|---|
| 4,918,497 | A | 4/1990 | Edmond | 357/17 |
| 4,935,665 | A | 6/1990 | Murata | 313/500 |
| 4,946,547 | A | 8/1990 | Palmour et al. | 156/643 |
| 4,966,862 | A | 10/1990 | Edmond | 437/100 |
| 4,984,034 | A * | 1/1991 | Yamazaki | 257/88 |
| 5,027,168 | A | 6/1991 | Edmond | 357/17 |
| 5,200,022 | A | 4/1993 | Kong et al. | 156/612 |
| 5,210,051 | A | 5/1993 | Carter, Jr. | 437/107 |
| 5,277,840 | A | 1/1994 | Osaka et al. | 252/301.36 |
| 5,338,944 | A | 8/1994 | Edmond et al. | 257/76 |
| RE34,861 | E | 2/1995 | Davis et al. | 437/100 |
| 5,393,993 | A | 2/1995 | Edmond et al. | 257/77 |
| 5,416,342 | A | 5/1995 | Edmond et al. | 257/76 |
| 5,523,589 | A | 6/1996 | Edmond et al. | 257/77 |
| 5,604,135 | A | 2/1997 | Edmond et al. | 437/22 |
| 5,614,131 | A | 3/1997 | Mukerji et al. | 264/1.9 |
| 5,631,190 | A | 5/1997 | Negley | 438/33 |
| 5,739,554 | A | 4/1998 | Edmond et al. | 257/103 |
| 5,766,987 | A | 6/1998 | Mitchell et al. | 438/126 |
| 5,813,753 | A | 9/1998 | Vriens et al. | |
| 5,849,354 | A | 12/1998 | Tsuchiyama | 427/73 |
| 5,858,278 | A | 1/1999 | Itoh et al. | 252/301.4 R |
| 5,912,477 | A | 6/1999 | Negley | 257/95 |
| 5,923,053 | A | 7/1999 | Jakowetz et al. | 257/95 |
| 5,959,316 | A | 9/1999 | Lowery | |
| 5,998,925 | A | 12/1999 | Shimizu et al. | 313/503 |
| 6,001,671 | A | 12/1999 | Fjelstad | 438/112 |
| 6,066,861 | A | 5/2000 | Hohn et al. | |
| 6,069,440 | A | 5/2000 | Shimizu et al. | 313/486 |
| 6,087,202 | A | 7/2000 | Exposito et al. | 438/113 |
| 6,120,600 | A | 9/2000 | Edmond et al. | 117/89 |
| 6,132,072 | A | 10/2000 | Turnbull et al. | 362/494 |
| 6,139,304 | A | 10/2000 | Centofante | 425/121 |
| 6,153,448 | A | 11/2000 | Takahashi et al. | |
| 6,157,086 | A | 12/2000 | Weber | 257/788 |
| 6,187,606 | B1 | 2/2001 | Edmond et al. | 438/46 |
| 6,201,262 | B1 | 3/2001 | Edmond et al. | 257/77 |
| 6,245,259 | B1 * | 6/2001 | Hohn et al. | 252/301.36 |
| 6,252,254 | B1 * | 6/2001 | Soules et al. | 257/89 |
| 6,257,737 | B1 | 7/2001 | Marshall et al. | |
| 6,274,690 | B1 | 8/2001 | Hoshida et al. | |
| 6,329,224 | B1 | 12/2001 | Nguyen et al. | 438/127 |
| 6,331,063 | B1 | 12/2001 | Kamada et al. | 362/237 |
| 6,333,522 | B1 | 12/2001 | Inoue et al. | 257/99 |
| 6,338,813 | B1 | 1/2002 | Hsu et al. | 264/272.14 |
| 6,366,018 | B1 | 4/2002 | Garbuzov | |
| 6,376,277 | B2 | 4/2002 | Corisis | 438/106 |
| 6,404,125 | B1 | 6/2002 | Garbuzov et al. | 313/499 |
| 6,410,942 | B1 * | 6/2002 | Thibeault et al. | 257/88 |
| 6,468,832 | B1 | 10/2002 | Mostafazadeh | 438/112 |
| 6,531,328 | B1 | 3/2003 | Chen | 438/26 |
| 6,576,488 | B2 | 6/2003 | Collins, III et al. | 438/29 |
| 6,583,444 | B2 | 6/2003 | Fjelstad | 257/82 |
| 6,614,103 | B1 | 9/2003 | Durocher et al. | 257/678 |
| 6,624,058 | B1 | 9/2003 | Kazama | 438/612 |
| 6,635,263 | B2 | 10/2003 | Tanida et al. | 424/401 |
| 6,642,652 | B2 | 11/2003 | Collins, III et al. | 313/512 |
| 6,650,044 | B1 * | 11/2003 | Lowery | 313/502 |
| 6,653,765 | B1 | 11/2003 | Levinson et al. | |
| 6,664,560 | B2 | 12/2003 | Emerson et al. | |
| 6,686,676 | B2 | 2/2004 | McNulty | |
| 6,733,711 | B2 | 5/2004 | Durocher et al. | 264/272.14 |
| 6,734,033 | B2 | 5/2004 | Emerson et al. | |
| 6,759,266 | B1 | 7/2004 | Hoffman | 438/64 |
| 6,759,723 | B2 | 7/2004 | Silverbrook | 257/433 |
| 6,791,119 | B2 | 9/2004 | Slater, Jr. et al. | 257/99 |
| 6,793,371 | B2 | 9/2004 | Lamke et al. | 362/241 |
| 6,812,500 | B2 | 11/2004 | Reeh et al. | 257/98 |
| 6,853,010 | B2 | 2/2005 | Slater, Jr. et al. | 257/98 |
| 6,860,621 | B2 | 3/2005 | Bachl et al. | 362/373 |
| 6,878,563 | B2 | 4/2005 | Bader et al. | 438/22 |
| 6,919,683 | B1 | 7/2005 | Jang | 313/503 |
| 6,921,929 | B2 | 7/2005 | LeBoeuf et al. | 257/100 |
| 6,924,233 | B1 | 8/2005 | Chua et al. | |
| 6,936,862 | B1 | 8/2005 | Chang et al. | |
| 6,958,497 | B2 | 10/2005 | Emerson et al. | 257/94 |
| 6,967,116 | B2 | 11/2005 | Negley | |
| 7,023,019 | B2 | 4/2006 | Maeda | |
| 7,029,935 | B2 | 4/2006 | Negley et al. | |
| 7,042,020 | B2 | 5/2006 | Negley | |
| 7,049,159 | B2 | 5/2006 | Lowery | 438/22 |
| 7,078,737 | B2 | 7/2006 | Yuri | |
| 7,183,586 | B2 | 2/2007 | Ichihara | |
| 7,183,587 | B2 | 2/2007 | Negley et al. | 257/99 |
| 7,202,598 | B2 | 4/2007 | Juestel et al. | 313/503 |
| 7,246,923 | B2 | 7/2007 | Conner | |
| 7,259,402 | B2 | 8/2007 | Edmond et al. | |
| 7,286,296 | B2 | 10/2007 | Chaves et al. | 359/641 |
| 7,566,639 | B2 | 7/2009 | Kohda | 438/463 |
| 7,816,705 | B2 | 10/2010 | Lee et al. | 257/99 |
| 8,610,145 | B2 | 12/2013 | Yano | 257/98 |
| 2001/0000622 | A1 | 5/2001 | Reeh | |
| 2001/0007484 | A1 | 7/2001 | Sakamaki | 349/2 |
| 2001/0015442 | A1 * | 8/2001 | Kondoh et al. | 257/79 |
| 2001/0019177 | A1 | 9/2001 | Sugihara | 257/780 |
| 2001/0038166 | A1 | 11/2001 | Weber | 264/272 |
| 2002/0001869 | A1 | 1/2002 | Fjelstad | |
| 2002/0006040 | A1 | 1/2002 | Kamada et al. | |
| 2002/0024299 | A1 | 2/2002 | Okazaki | |
| 2002/0028527 | A1 | 3/2002 | Maeda et al. | |
| 2002/0048905 | A1 * | 4/2002 | Ikegami et al. | 438/464 |
| 2002/0056847 | A1 | 5/2002 | Uemura et al. | |
| 2002/0057057 | A1 | 5/2002 | Sorg | |
| 2002/0063520 | A1 | 5/2002 | Yu et al. | |
| 2002/0070449 | A1 | 6/2002 | Yagi et al. | |
| 2002/0079837 | A1 | 6/2002 | Okazaki | |
| 2002/0088985 | A1 | 7/2002 | Komoto et al. | |
| 2002/0096789 | A1 | 7/2002 | Bolken | |
| 2002/0105266 | A1 | 8/2002 | Juestel et al. | |
| 2002/0123164 | A1 | 9/2002 | Slater, Jr. et al. | |
| 2002/0158578 | A1 | 10/2002 | Eliashevich et al. | 313/512 |
| 2002/0185965 | A1 | 12/2002 | Collins, III et al. | |
| 2002/0195935 | A1 | 12/2002 | Jager et al. | |
| 2003/0006418 | A1 | 1/2003 | Emerson et al. | |
| 2003/0066311 | A1 | 4/2003 | Li et al. | |
| 2003/0079989 | A1 | 5/2003 | Klocke et al. | |
| 2003/0160258 | A1 | 8/2003 | Oohata | |
| 2003/0181122 | A1 * | 9/2003 | Collins et al. | 445/24 |
| 2003/0207500 | A1 | 11/2003 | Pichler et al. | |
| 2004/0004435 | A1 | 1/2004 | Hsu | |
| 2004/0012958 | A1 | 1/2004 | Hashimoto | |
| 2004/0031952 | A1 | 2/2004 | Oosedo et al. | |
| 2004/0037949 | A1 | 2/2004 | Wright | |
| 2004/0038442 | A1 | 2/2004 | Kinsman | |
| 2004/0041159 | A1 | 3/2004 | Yuri et al. | |
| 2004/0041222 | A1 | 3/2004 | Loh | |
| 2004/0056260 | A1 | 3/2004 | Slater, et al. | 257/79 |
| 2004/0061115 | A1 | 4/2004 | Kozawa et al. | |
| 2004/0061433 | A1 | 4/2004 | Izuno et al. | 313/498 |
| 2004/0106234 | A1 | 6/2004 | Sorg et al. | |
| 2004/0124429 | A1 | 7/2004 | Stokes | |
| 2004/0140765 | A1 | 7/2004 | Takekuma et al. | |
| 2004/0164307 | A1 | 8/2004 | Mueller-Mach et al. | |
| 2004/0164311 | A1 | 8/2004 | Uemura | |
| 2004/0170018 | A1 | 9/2004 | Nawashiro | |
| 2004/0173806 | A1 | 9/2004 | Chua | |
| 2004/0180475 | A1 | 9/2004 | Shibata et al. | 438/127 |
| 2004/0188697 | A1 | 9/2004 | Brunner et al. | |
| 2004/0245530 | A1 | 12/2004 | Kameyama | |
| 2004/0256974 | A1 | 12/2004 | Mueller-Mach et al. | |
| 2004/0263073 | A1 | 12/2004 | Baroky et al. | 313/512 |
| 2005/0001225 | A1 | 1/2005 | Yoshimura et al. | |

(56) References Cited

U.S. PATENT DOCUMENTS

| | | | |
|---|---|---|---|
| 2005/0002168 A1 | 1/2005 | Narhi et al. | |
| 2005/0006651 A1 | 1/2005 | LeBoeuf et al. | |
| 2005/0051782 A1 | 3/2005 | Negley et al. | |
| 2005/0062140 A1 | 3/2005 | Leung et al. | |
| 2005/0072981 A1 | 4/2005 | Suenaga | |
| 2005/0080193 A1 | 4/2005 | Woulters et al. | 525/191 |
| 2005/0093004 A1 | 5/2005 | Yoo | |
| 2005/0145991 A1 | 7/2005 | Sakamoto et al. | |
| 2005/0167682 A1 | 8/2005 | Fukasawa | |
| 2005/0184305 A1 | 8/2005 | Ueda | |
| 2005/0184638 A1 | 8/2005 | Mueller | |
| 2005/0194606 A1 | 9/2005 | Oohata | 257/99 |
| 2005/0196886 A1 | 9/2005 | Jager et al. | |
| 2005/0211910 A1 | 9/2005 | Mori et al. | |
| 2005/0219835 A1 | 10/2005 | Nagayama | |
| 2005/0221519 A1 | 10/2005 | Leung et al. | |
| 2005/0243237 A1 | 11/2005 | Sasuga | 349/57 |
| 2005/0259423 A1 | 11/2005 | Heuser et al. | 362/293 |
| 2005/0265404 A1 | 12/2005 | Ashdown | |
| 2005/0269592 A1 | 12/2005 | Lee et al. | 257/100 |
| 2006/0001046 A1 | 1/2006 | Batres et al. | |
| 2006/0003477 A1 | 1/2006 | Braune et al. | 438/29 |
| 2006/0027820 A1 | 2/2006 | Cao | 257/89 |
| 2006/0060867 A1 | 3/2006 | Suehiro | |
| 2006/0060872 A1 | 3/2006 | Edmond et al. | |
| 2006/0060874 A1 | 3/2006 | Edmond et al. | |
| 2006/0060879 A1 | 3/2006 | Edmond et al. | |
| 2006/0065906 A1 | 3/2006 | Harada | |
| 2006/0091788 A1 | 5/2006 | Yan | |
| 2006/0102991 A1 | 5/2006 | Sakano | |
| 2006/0118529 A1 | 6/2006 | Fujii | |
| 2006/0124947 A1 | 6/2006 | Mueller et al. | 257/98 |
| 2006/0138937 A1 | 6/2006 | Ibbetson | |
| 2006/0145170 A1 | 7/2006 | Cho | |
| 2006/0157721 A1 | 7/2006 | Tran et al. | |
| 2006/0189098 A1 | 8/2006 | Edmond | |
| 2006/0202105 A1 | 9/2006 | Krames et al. | |
| 2006/0267042 A1 | 11/2006 | Izuno | |
| 2006/0284195 A1 | 12/2006 | Nagai | |
| 2007/0012940 A1 | 1/2007 | Suh et al. | |
| 2007/0034995 A1 | 2/2007 | Kameyama | |
| 2007/0037307 A1 | 2/2007 | Donofrio | |
| 2007/0092636 A1 | 4/2007 | Thompson et al. | |
| 2007/0096131 A1 | 5/2007 | Chandra | |
| 2007/0114559 A1 | 5/2007 | Sayers et al. | 257/100 |
| 2007/0138941 A1 | 6/2007 | Jin et al. | 313/503 |
| 2007/0158668 A1 | 7/2007 | Tarsa et al. | |
| 2007/0158669 A1 | 7/2007 | Lee et al. | |
| 2007/0215890 A1 | 9/2007 | Harbers | |
| 2007/0259206 A1 | 11/2007 | Oshio | |
| 2007/0278502 A1 | 12/2007 | Shakuda et al. | 257/88 |
| 2008/0006815 A1 | 1/2008 | Wang et al. | |
| 2008/0149455 A1 | 6/2008 | Aas et al. | |
| 2008/0173884 A1 | 7/2008 | Chitnis et al. | 257/98 |
| 2008/0203410 A1 | 8/2008 | Brunner et al. | |
| 2008/0283865 A1 | 11/2008 | Yoo | |
| 2009/0086492 A1 | 4/2009 | Meyer | 362/294 |
| 2009/0101930 A1 | 4/2009 | Li | 257/98 |
| 2009/0154195 A1 | 6/2009 | Ishii et al. | 362/612 |
| 2009/0322197 A1 | 12/2009 | Helbing | 313/46 |
| 2012/0043886 A1 | 2/2012 | Ji et al. | 315/51 |

FOREIGN PATENT DOCUMENTS

| | | | | |
|---|---|---|---|---|
| CN | 1476050 | | 2/2004 | |
| CN | 1547265 | | 11/2004 | |
| CN | 1866561 | A | 11/2006 | |
| DE | 19638667 | | 4/1998 | |
| DE | 19945672 | A1 | 4/2000 | |
| DE | 69702929 | | 2/2001 | |
| DE | 102005000800 | | 8/2005 | |
| DE | 102005013265 | | 12/2005 | |
| DE | 102005042814 | | 4/2006 | |
| DE | 102005062514 | | 3/2007 | |
| EP | 0732740 | A2 | 9/1996 | |
| EP | 1017112 | | 7/2000 | |
| EP | 1 059 678 | A | 12/2000 | |
| EP | 1059678 | | 12/2000 | |
| EP | 1 138 747 | A2 | 10/2001 | |
| EP | 1138747 | | 10/2001 | |
| EP | 1198016 | A2 | 10/2001 | |
| EP | 198016 | A2 | 4/2002 | |
| EP | 1198005 | A | 4/2002 | |
| EP | 1367655 | | 12/2003 | |
| EP | 1385215 | A2 | 1/2004 | |
| EP | 1724848 | A2 | 11/2006 | |
| EP | 1804304 | A2 | 7/2007 | |
| FR | 2704690 | | 11/1994 | |
| JP | 61048951 | | 3/1986 | |
| JP | 59027559 | | 2/1987 | |
| JP | 02-086150 | | 3/1990 | |
| JP | 402086150 | | 3/1990 | |
| JP | 4233454 | | 8/1992 | |
| JP | 10107325 | | 4/1998 | |
| JP | H10107325 | | 4/1998 | |
| JP | 10-163525 | | 6/1998 | |
| JP | 10163525 | | 6/1998 | |
| JP | 10247750 | A | 9/1998 | |
| JP | 10261821 | A | 9/1998 | |
| JP | H0261821 | | 9/1998 | |
| JP | 11087778 | | 3/1999 | |
| JP | 11276932 | | 10/1999 | |
| JP | 2002101147 | | 4/2000 | |
| JP | 2000-164937 | A | 6/2000 | |
| JP | 2000164930 | | 6/2000 | |
| JP | 2000164937 | | 6/2000 | |
| JP | 2000208820 | A | 7/2000 | |
| JP | 2002208822 | | 7/2000 | |
| JP | 2000-243728 | * | 8/2000 | H01L 21/301 |
| JP | 2000243728 | | 8/2000 | |
| JP | 2000277551 | A | 10/2000 | |
| JP | 2000-349346 | | 12/2000 | |
| JP | 2001308116 | A | 11/2001 | |
| JP | 2001345480 | | 12/2001 | |
| JP | 2002009097 | A | 1/2002 | |
| JP | 2002-050799 | | 2/2002 | |
| JP | 200250799 | | 2/2002 | |
| JP | 2002050799 | | 2/2002 | |
| JP | 2002-093830 | | 3/2002 | |
| JP | 2002076445 | | 3/2002 | |
| JP | 2002-118293 | | 4/2002 | |
| JP | 2002118293 | | 4/2002 | |
| JP | 2002261325 | | 9/2002 | |
| JP | 2002280607 | | 9/2002 | |
| JP | 2002319704 | | 10/2002 | |
| JP | 2002374006 | | 12/2002 | |
| JP | 2003-007929 | | 1/2003 | |
| JP | 2003007929 | | 1/2003 | |
| JP | 2003046141 | | 2/2003 | |
| JP | 2003-115614 | | 4/2003 | |
| JP | 2003110153 | | 4/2003 | |
| JP | 2003115614 | | 4/2003 | |
| JP | 2003-170465 | | 6/2003 | |
| JP | 2003-197655 | | 7/2003 | |
| JP | 2003224307 | | 8/2003 | |
| JP | 2003234511 | | 8/2003 | |
| JP | 2003-258011 | | 9/2003 | |
| JP | 2004-031856 | | 1/2004 | |
| JP | 2004031856 | | 1/2004 | |
| JP | 2004095765 | | 3/2004 | |
| JP | 2004134699 | | 4/2004 | |
| JP | 2004186488 | | 7/2004 | |
| JP | 2004-266240 | | 9/2004 | |
| JP | 3589187 | B2 | 11/2004 | |
| JP | 2004-363342 | | 12/2004 | |
| JP | 2005005604 | | 1/2005 | |
| JP | 2005019838 | | 1/2005 | |
| JP | 2005064113 | | 3/2005 | |
| JP | 2005167079 | | 6/2005 | |
| JP | 2005-252222 | | 9/2005 | |
| JP | 2005252222 | | 9/2005 | |
| JP | 2005-298817 | | 10/2005 | |
| JP | 2005298817 | | 10/2005 | |

(56) References Cited

FOREIGN PATENT DOCUMENTS

| | | |
|---|---|---|
| JP | 2006-054209 | 2/2006 |
| JP | 2006032387 | 2/2006 |
| JP | 2006054209 | 2/2006 |
| JP | 20060495533 | 2/2006 |
| JP | 2006080565 | 3/2006 |
| JP | 2006114637 | 4/2006 |
| JP | 2006165416 | 6/2006 |
| JP | 2006-245020 | 9/2006 |
| JP | 2006-253370 | 9/2006 |
| JP | 2006313886 | 11/2006 |
| JP | 2007063538 | 3/2007 |
| JP | 2008-129043 A | 6/2008 |
| JP | 2008-218511 A | 9/2008 |
| JP | 2000-299334 | 10/2010 |
| KR | 200412776 | 2/2004 |
| KR | 2004-0017926 | 3/2004 |
| KR | 200417926 | 3/2004 |
| KR | 200429313 | 4/2004 |
| TW | 522423 | 3/2003 |
| TW | 581325 U | 3/2004 |
| TW | 595012 | 6/2004 |
| WO | WO0033390 | 6/2000 |
| WO | WO0124283 A1 | 4/2001 |
| WO | WO02061847 | 8/2002 |
| WO | WO02061847 A1 | 8/2002 |
| WO | WO03001612 | 1/2003 |
| WO | WO 03/021668 | 3/2003 |
| WO | WO 03/021668 A1 | 3/2003 |
| WO | WO03021691 A1 | 3/2003 |
| WO | WO2004020704 | 3/2004 |
| WO | WO2005101909 | 10/2005 |
| WO | WO2006033695 A2 | 3/2006 |
| WO | WO2006036251 A1 | 4/2006 |
| WO | WO 2006/065015 | 6/2006 |
| WO | WO2006135496 A2 | 12/2006 |
| WO | WO2007018560 | 2/2007 |
| WO | WO2007136956 | 11/2007 |
| WO | WO2008003176 A1 | 1/2008 |

OTHER PUBLICATIONS

International Materials Reviews, "Materials for Field Emission Displays", A.P. Burden 2001.
Notice of Rejection (Final) in Japanese Patent Application No. 2006-526964 dated Feb. 22, 2011.
Minutes of Oral Proceedings (EPO Form 2009) in European Patent Application No. 05808825.3 dated Feb. 3, 2011.
Summons to Attend Oral Proceedings in European Patent Application No. 05808825.3 dated Feb. 3, 2011.
Office Action from related U.S. Appl. No. 10/666,399, dated: Nov. 18, 2004.
Response to related Office Action U.S. Appl. No. 10/666,399, dated: Mar. 18, 2005.
Office Action from related U.S. Appl. No. 10/666,399, dated: May 13, 2005.
Response to related Office Action U.S. Appl. No. 10/666,399, dated: Aug. 15, 2005.
Office Action from related U.S. Appl. No. 10/666,399, dated: Sep. 30, 2005.
Response to related Office Action U.S. Appl. No. 10/666,399, dated: Jun. 30, 2006.
Office Action from related U.S. Appl. No. 10/666,399, dated: Feb. 28, 2006.
Response to related Office Action U.S. Appl. No. 10/666,399, dated: Jun. 28, 2006.
Office Action from related U.S. Appl. No. 10/666,399, dated: Aug. 30, 2006.
Response to related Office Action U.S. Appl. No. 10/666,399, dated: Nov. 30, 2006.
Office Action from related U.S. Appl. No. 10/666,399, dated: Feb. 14, 2007.
Response to related Office Action U.S. Appl. No. 10/666,399, dated: Jun. 18, 2007.
Office Action from related U.S. Appl. No. 10/666,399, dated: Jul. 19, 2007.
Response to related Office Action U.S. Appl. No. 10/666,399, dated: Jan. 22, 2008.
Office Action from related U.S. Appl. No. 10/666,399, dated: Sep. 5, 2008.
Response to related Office Action U.S. Appl. No. 10/666,399, dated: Feb. 5, 2009.
Office Action from related U.S. Appl. No. 10/666,399, dated: Mar. 6, 2009.
Response to related Office Action U.S. Appl. No. 10/666,399, dated: Sep. 8, 2009.
Office Action from related U.S. Appl. No. 10/666,399, dated: Dec. 22, 2009.
Response to related Office Action U.S. Appl. No. 10/666,399, dated: Mar. 22, 2010.
International Search Report for PCT/US2007/024367, Dated: Oct. 22, 2008.
Patent Abstracts of Japan 2004-221185 Aug. 5, 2004.
Patent Abstracts of Japan 11-040858, Feb. 12, 1999.
Patent Abstract of Japan 2001-181613, Jul. 3, 2001.
Official Notice of Final Decision of Rejection re: related Japanese Patent Application No. 2007-533459, dated: Dec. 26, 2008.
Rejection Decision re: related Chinese Patent Application No. 200580031382.3, dated: Feb. 2, 2009.
Communication pursuant to Article 94(3) EPC re: related European Application No. 05808825.3, dated: Feb. 18, 2009.
Nichia Corp.White LED, Part Nos. NSPW300BS, NSPW312BS, p. 1-3, 2000.
NPO-30394, Electrophoretic Deposition for Fabricating Microbatteries, p. 1-2, NASA Tech Briefs Issue. May 3, 2003.
PCT Search Report and Written Opinion for PCT Application No. US2007/007600, Dated:Oct. 31, 2007.
Japanese Publication No. JP2005033138(A), Date: Feb. 3, 2005 to Shoji Iwao;Fujisawa Shigeo.
Paten Abstracts of Japan, Publication No. 2002-050799, Dated: Feb. 15, 2002.
Official Notice of Rejection from Japanese Patent Application No. 2006-526964, dated: Feb. 16, 2010.
Notice of ReExamination for Chinese Application No. 200580031382.3, dated: May 28, 2010.
Office Action from U.S. Appl. No. 12/506,989, dated: Apr. 7, 2010.
Response to Office Action for U.S. Appl. No. 12/506,989, filed May 24, 2010.
Office Action from U.S. Appl. No. 10/666,399, dated: Apr. 16, 2008.
Response to Office Action for U.S. Appl. No. 10/666,399, filed Jun. 16, 2008.
Office Action from U.S. Appl. No. 10/666,399, dated: May 11, 2010.
Response to Office Action U.S. Appl. No. 10/666,399, filed: Aug. 11, 2010.
Office Action from U.S. Appl. No. 12/506,989, dated; Jul. 23, 2010.
Office Action from U.S. Appl. No. 11/656,759, dated: Nov. 25, 2009.
Response to Office Action U.S. Appl. No. 11/656,759, filed: Apr. 26, 2010.
Office Action from U.S. Appl. No. 11/982,276, dated: Dec. 7, 2009.
Response to Office Action U.S. Appl. No. 11/982,276, filed:Feb. 5, 2010.
Office Action from U.S. Appl. No. 12/077,638, dated: Dec. 8, 2009.
Reply to Office Action U.S. Appl. No. 12/077,638, filed: Feb. 26, 2010.
Office Action from U.S. Appl. No. 12/008,477, dated: Mar. 1, 2010.
Response to Office Action U.S. Appl. No. 12/008,477, filed: May 26, 2010.
Office Action from U.S. Appl. No. 11/881,683, dated: Feb. 5, 2010.
Response to Office Action U.S. Appl. No. 11/881,683, filed: Apr. 28, 2010.
Office Action from U.S. Appl. No. 11/398,214, dated: Dec. 11, 2009.
Response to Office Action U.S. Appl. No. 11/398,214, filed: Mar. 2, 2010.
International Search Report and Written Opinion from related PCT Application No. PCT/US2009/001572, dated: Jul. 17, 2009.

(56) References Cited

OTHER PUBLICATIONS

Patent Abstracts of Japan, Publication No. 2003-258011 dated Sep. 12, 2003.
Patent Abstracts of Japan, Publication No. 2002-093830 dated Mar. 29, 2002.
First Office Action for European Patent Application No. 07754163.9 dated Feb. 28, 2011.
Notice of Rejection (Final) in counterpart Japanese Patent Application No. 2006-526964 dated Feb. 22, 2011.
Minutes of Oral Proceedings (EPO Form 2009) in European Patent Application No. 05808825.3 dated Feb. 23, 2011.
Summons to Attend Oral Proceedings in European Patent Application No. 05808825.3 dated Feb. 23, 2011.
Summons to attend oral proceedings pursuant to Rule 115(1) EPC, for Application No. 05808825.302203/1797597, dated: Sep. 9, 2010.
Notification of the First Office Action for China Application No. 200780050127.2, dated: Aug. 12, 2010.
International Search Report and Written Opinion for PCT/US2007/024367, dated:Oct. 22, 2008.
Official Notice of Rejection for Japan Application No. 2007-533459, dated: Jul. 16, 2010.
Notice of the First Office Action for China Application No. 200780012387.0, dated: Jun. 30, 2010.
Japan Publication No. JP2003318448 A, date: Nov. 7, 2003.
Notification of First Office Action for China Application No. 200780050197.8, date: Sep. 10, 2010.
Notification of First Office Action for China Application No. 200580031382.3, date: Oct. 27, 2010.
Official Notice of Rejection for Japan Application No. 2007-533459, dated: Dec. 26, 2008.
Office Action from U.S. Appl. No. 11/982,276, mailed Aug. 19, 2010.
Response to Office Action from U.S. Appl. No. 11/982,276, filed Nov. 2, 2010.
Office Action from U.S. Appl. No. 11/899,790, mailed on Jun. 2, 2010.
Response to Office Action for U.S. Appl. No. 11/899,790, filed Nov. 1, 2010.
Office Action from U.S. Appl. No. 11/881,683, mailed May 12, 2010.
Response to Office Action for U.S. Appl. No. 11/881,683, filed: Aug. 3, 2010.
Office Action from U.S. Appl. No. 11/595,720, mailed May 14, 2010.
Response to Office Action for U.S. Appl. No. 11/595,720, mailed: Jul. 6, 2010.
Notice of Allowance for U.S. Appl. No. 10/666,399, mailed Oct. 14, 2010.
Office Action for U.S. Appl. No. 12/077,638, mailed Jul. 7, 2010.
Response to Office Action for U.S. Appl. No. 12/077,638, filed: Aug. 30, 2010.
Office Action for U.S. Appl. No. 11/982,276, mailed Mar. 25, 2010.
Response to Office Action for U.S. Appl. No. 11/982,276, mailed Jun. 21, 2010.
Office Action for U.S. Appl. No. 12/077,638, mailed Sep. 22, 2010.
Office Action for U.S. Appl. No. 12/077,638, mailed Dec. 21, 2010.
Office Action for U.S. Appl. No. 11/827,626, mailed Oct. 7, 2010.
Office Action for U.S. Appl. No. 12/008,477, mailed Oct. 7, 2010.
Office Action for U.S. Appl. No. 12/506,989, mailed Mar. 8, 2011.
Office Action for U.S. Appl. No. 11/656,759, mailed Mar. 9, 2011.
Office Action for U.S. Appl. No. 11/656,759, mailed May 21, 2010.
Office Action for U.S. Appl. No. 11/398,214, mailed Nov. 12, 2010.
Office Action for U.S. Appl. No. 11/881,683, mailed Oct. 14, 2010.
Office Action for U.S. Appl. No. 11/827,626, mailed Apr. 1, 2011.
Office Action for U.S. Appl. No. 11/899,790, mailed Mar. 21, 2011.
Office Action from counterpart Taiwan Patent Application No. 093128231 issued Apr. 21, 2011.
Second Office Action for Chinese Patent Application No. 200780050127.2 dated Jun. 15, 2011.
International Preliminary Examination Report for PCT Application No. PCT/US07/24366 mailed Jun. 29, 2011.
International Preliminary Examination Report for PCT Application No. PCT/US07/24367 mailed Jun. 29, 2011.
Decision to Refuse a European Patent Application regarding EP 05 808 825.3 dated Jun. 14, 2011.
Office Action for Korean Patent Application No. 10-2007-7008694 mailed Aug. 7, 2011.
Notification of Reasons for Rejection for Japanese Patent Application No. 2009-547219 dated Sep. 16, 2011.
Notification of Reasons for Rejection for Japanese Patent Application No. 2009-547218 dated Sep. 16, 2011.
Notice of Rejection of counterpart Japanese Patent Application No. 2006-526964 issued Sep. 13, 2011.
Notice of Reasons for Rejection for Japanese Patent Application No. JP 2008-317576 dated Sep. 13, 2011.
Notification of the First Office Action in Chinese Patent Application No. 201110029365.3 mailed Jan. 4, 2012.
Notice of Results of Re-Consideration Prior to Appeal from Korean Patent Application No. 10-2007-7008694, dated Sep. 21, 2012.
Rejection Decision for Chinese Patent Application No. 201110029365.3, dated Sep. 10, 2012.
Noting of Loss of Rights from European Application No. 04783941.0-2203/1665361. dated Nov. 6, 2012.
Notification of Reasons for Rejection for Japanese Patent Appl. No. 2011-279356, dated Jan. 23, 2013.
Office Action from Japanese Office Action, Application No. 2011-224055, dated Feb. 7, 2013.
Rejection Decision from Taiwanese Patent Appl. No. 094122646, dated Dec. 14, 2012.
Decision of Rejection from Japanese Patent Appl. No. 2008-317576, dated Dec. 18, 2012.
Decision of Rejection from Japanese Patent Appl. No. 2006-526964, dated Dec. 18, 2012.
Second Office Action from Chinese Patent Application No. 20101029016.2, dated Dec. 24, 2012.
Official Action from European Patent Application No. 07879932.3, dated Nov. 13, 2012.
Official Action from European Patent Application No. 07840092.6, dated Nov. 13, 2012.
Notice of Reasons for Rejection from Japanese Patent appl. No. 2012-026326, dated May 28, 2013.
Notice of Reasons for Rejection from Japanese Patent appl. No. 2012-026327, dated May 28, 2013.
Examination Report from European Patent Appl. No. 04 783 941.0-1555, dated Jul. 25, 2013.
Rejection Decision from Chinese Patent Appl. No. 201010279016.2, dated Jun. 21, 2013.
Office Action from U.S. Appl. No. 11/656,759, dated May 1, 2012.
Response to OA from U.S. Appl. No. 11/656,759, filed Jun. 26, 2012.
Office Action from U.S. Appl. No. 12/862,640, dated Jun. 29, 2012.
Response to OA from U.S. Appl. No. 12/862,640, filed Sep. 20, 2012.
Office Action from U.S. Appl. No. 12/506,989, dated Jul. 6, 2012.
Response to OA from U.S. Appl. No. 12/506,989, filed Oct. 11, 2012.
Office Action from U.S. Appl. No. 12/842,639, dated Aug. 14, 2012.
Response to OA from U.S. Appl. No. 12/842,639, filed Nov. 9, 2012.
Office Action from U.S. Appl. No. 12/862,640, dated Oct. 2, 2012.
Response to OA from U.S. Appl. No. 12/862,640, filed Apr. 17, 2013.
Office Action from U.S. Appl. No. 12/506,989, dated Oct. 24, 2012.
Response to OA from U.S. Appl. No. 12/506,989, filed Dec. 4, 2012.
Office Action from U.S. Appl. No. 11/899,790, dated Dec. 5, 2012.
Response to OA from U.S. Appl. No. 11/899,790, filed Feb. 27, 2013.
Office Action from U.S. Appl. No. 12/506,989, dated Jan. 18, 2013.
Response to OA from U.S. Appl. No. 12/506,989, filed Apr. 18, 2013.
Office Action from U.S. Appl. No. 12/862,640, dated Jan. 24, 2013.
Office Action from U.S. Appl. No. 11/656,759, dated Feb. 13, 2013.
Response to OA from U.S. Appl. No. 11/656,759, filed May 13, 2013.
Office Action from U.S. Appl. No. 11/656,759, dated Jul. 2, 2013.
Response to OA from U.S. Appl. No. 11/656,759, filed Aug. 21, 2013.
Office Action from U.S. Appl. No. 11/899,790, dated May 1, 2013.
Response to OA from U.S. Appl. No. 11/899,790, filed Jun. 18, 2013.
Office Action from U.S. Appl. No. 12/862,640, dated Apr. 30, 2013.
Office Action from U.S. Appl. No. 12/842,639, dated Mar. 7, 2013.
Response to OA from U.S. Appl. No. 12/842,639, filed Jun. 5, 2013.
Office Action from U.S. Appl. No. 12/506,989, dated Sep. 5, 2013.
Office Action from U.S. Appl. No. 11/899,790, dated Sep. 17, 2013.

(56) References Cited

OTHER PUBLICATIONS

Office Action from U.S. Appl. No. 12/008,477, dated Sep. 3, 2013.
Interrogation from Japanese Patent Appl. No. 2008-317576, dated Jul. 9, 2013.
Decision of Final Rejection from Japanese Patent Appl. No. 2011-224055, dated Jul. 26, 2013.
Decision of Rejection from Japanese Patent appl. No. 2011-279356, dated Jul. 31, 2013.
Notice of Rejection from Japanese Patent Appl. No. 2008-527912, dated Jun. 5, 2013.
Notice of Rejection from Japanese Patent Appl. No. 2008-527912 issued Jun. 14, 2011.
International Preliminary Report on Patentability from Appl. No. PCT/US06/241384 dated: Jun. 12, 2008.
Nichia Corp. White LED, Part No. NSPW312BX, "Specification for Nichia White LED, Model NSW312BS", pp. 1-14, 2004.
Nichia Corp, White LED, Part No. NSPW300BS, Specifications for Nichia White LED, Model NSPW300BS, pp. 1-14, 2004.
Office Action from Japanese Patent Appl. No. 2007-216808, mailed Sep. 6, 2010.
Office Action from Japanese Patent Appl. No. 2011-224055, Jan. 12, 2012.
Decision of Final Rejection from Japanese Patent Appl. No. 2007-216808, dated Jan. 1, 2011.
Office Action from German Patent Appl. No. 10 2007 040 841.4-33, dated Sep. 17, 2009.
Office Action from German Patent Appl. No. 10 2007 040 811.2, dated Sep. 17, 2009.
Office Action from Chinese Patent Appl. No. 20070148326.9, dated Jun. 19, 2009, 2 pages.
Schubert, "Light-Emitting Diodes", Cambridge University Press, 2003, pp. 92-96.
First Office Action and Search Report from Chinese Patent Application No. 201210030627.2, dated Dec. 3, 2012.
Office Action (Brief Description of) from Chinese Patent Appl. No. 201010279016.2, dated Jan. 10, 2014.
IPT's Decision from Korean Patent Appl. No. 10-2007-7008694, dated Dec. 24, 2013.
Office Action from U.S. Appl. No. 12/862,640, dated Dec. 20, 2013.
Office Action from U.S. Appl. No. 11/656,759, dated Nov. 18, 2013.
Appeal Decision to Grant a Patent from Japanese Patent No. 2007-506279, dated Oct. 28, 2013.
Office Action from Korean Patent Appl. No. 10-2009-7017405, dated Oct. 23, 2013.
Notice of Allowance from Korean Patent Appl. No. 10-2009-7017405, dated: Feb. 18, 2014.
Search Report from Taiwanese Patent appl. No. 096143968, dated: Feb. 17, 2014.
Office Action from U.S. Appl. No. 11/899,790, dated Jun. 25, 2014.
Decision of Rejection from Japanese Patent Appl. No. 2012-026327, dated Apr. 8, 2014.
Brief Summary of Rejection Decision from Chinese Patent Appl. No. 201010279016.2 dated Apr. 22, 2014.
Preliminary Report from Japanese Patent Appl. No. 2013-020955 dated Dec. 26, 2013 (received May 8, 2014).
Preliminary Report from Japanese Patent Appl. No. 2013-024242 dated Feb. 26, 2014 (received May 8, 2014).
Office Action from Korean Patent Appl. No. 10-2009-7017407, dated Apr. 28, 2014.
Notification of Reexamination from Chinese Patent appl. No. 201110029365.3 dated May 7, 2014.
Office Action from U.S. Appl. No. 13/429,053, dated Apr. 11, 2014.
Office Action from U.S. Appl. No. 12/008,477, dated Apr. 25, 2014.
Response to OA from U.S. Appl. No. 12/008,477, filed May 27, 2014.
Office Action from U.S. Appl. No. 11/656,759, dated May 27, 2014.
Notification of Reexamination from Chinese Patent Appl. No. 200780050127.2, dated Jun. 3, 2014.
Notification of Allowance from Taiwan Patent Appl. No. 101130701, dated Jul. 15, 2014.
Office Action and Search Report from Taiwan Patent Appl. No. 097110195, dated Jul. 18, 2014.
Examination from European Appl. No. 04 783 941.0-1552, dated Mar. 6, 2014.
Office Action and Search Report from Taiwanese Patent Appl. No. 101130701, dated Feb. 6, 2014.
Search Report from Taiwanese Patent Appl. No. 097110195, dated Mar. 12, 2014.
Decision of Rejection from Japanese Patent appl. No. 2012-02326, dated Apr. 8, 2014.
First Office Action and Search Report from Chinese Patent Appl. No. 2012-10175686.9, dated: Mar. 31, 2014.
Translation of Office Action from Taiwanese Patent Appl. No. 096143968, dated Feb. 13, 2014.
Office Action from U.S. Appl. No. 11/899,790, dated Feb. 25, 2014.
Office Action from U.S. Appl. No. 12/506,989, dated Feb. 19, 2014.
Board Decision from Chinese Patent Appl. No. 201110029365.3, dated Aug. 13, 2014.
Second Office Action from Chinese Patent Appl. No. 201210175686.9, dated Sep. 3, 2014.
Office Action from Taiwanese Patent Appl. No. 097110195, dated Sep. 9, 2014.
Letter regarding unfavorable decision on appeal from Japanese Appl. No. 2011-279356, dated Nov. 12, 2014.
Preliminary Examination Report from Japanese Appl. No. 2012-026326, dated Oct. 1, 2014.
Third Office Action from Chinese Appl. No. 201210175686.9, dated Dec. 11, 2014.
Office Action from U.S. Appl. No. 13/429,053, dated Sep. 22, 2014.
Office Action from U.S. Appl. No. 12/862,640, dated Oct. 17, 2014.
Notification of re-examination from Chinese Appl. No. 201010279016.2, dated Jan. 9, 2015.
Summons to attend Oral Proceedings from European Appl. No. 08171399.2, dated Jan. 16, 2015.
Decision of Re-Examination from Chinese Appl. No. 201080001658.4, dated Dec. 29, 2014.
Fourth Examination from European Patent Appl. No. 04 783 941.0-1552, dated Oct. 7, 2014.
Summons to attend oral proceedings from European Patent Appl. No. 411.52.106724/0, dated Sep. 9, 2014.
Reexamination Decision from Chinese Patent Appl. No. 200780050127.2, dated Jan. 5, 2015.
Office Action from U.S. Appl. No. 14/209,652, dated Dec. 12, 2014.
Office Action from U.S. Appl. No. 12/506,989, dated Jan. 21, 2015.
Office Action U.S. Appl. No. 12/008,477, mailed Apr. 12, 2011.
Response to Office Action U.S. Appl. No. 12/008,477, filed Jun. 27, 2011.
Office Action U.S. Appl. No. 11/899,790, mailed Jul. 27, 2011.
Response to Office Action U.S. Appl. No. 11/899,790, filed Nov. 22, 2011.
Office Action U.S. Appl. No. 12/506,989, mailed on Jul. 20, 2011.
Response to Office Action U.S. Appl. No. 12/506,989, filed on Nov. 21, 2011.
Office Action U.S. Appl. No. 12/287,764, mailed Jul. 30, 2010.
Response to Office Action U.S. Appl. No. 12/287,764, filed Nov. 30, 2010.
Office Action U.S. Appl. No. 11/956,989, mailed Apr. 16, 2010.
Response to Office Action U.S. Appl. No. 11/956,989, filed Jun. 14, 2010.
Response to Office Action U.S. Appl. No. 11/956,989, filed Jul. 14, 2010.
Office Action U.S. Appl. No. 12/287,764, mailed Mar. 25, 2010.
Response to Office Action U.S. Appl. No. 12/287,764, filed Jul. 21, 2010.
Office Action U.S. Appl. No. 12/287,764, mailed May 17, 2011.
Response to Office Action U.S. Appl. No. 12/287,764, filed Oct. 10, 2011.
Office Action U.S. Appl. No. 11/656,759, mailed Sep. 23, 2011.
Response to Office Action U.S. Appl. No. 11/656,759, filed Jan. 16, 2012.
Office Action U.S. Appl. No. 12/008,477, mailed Sep. 19, 2011.
Response to Office Action U.S. Appl. No. 12/008,477, filed Jan. 25, 2012.

(56) References Cited

OTHER PUBLICATIONS

Office Action U.S. Appl. No. 12/862,640, mailed Aug. 19, 2011.
Response to Office Action U.S. Appl. No. 12/862,640, filed Feb. 21, 2012.
Office Action U.S. Appl. No. 12/287,764, mailed Oct. 26, 2011.
Response to Office Action U.S. Appl. No. 12/287,764, filed Mar. 6, 2012.
Office Action U.S. Appl. No. 12/506,989, mailed Dec. 27, 2011.
Office Action U.S. Appl. No. 11/899,790, mailed Jan. 12, 2012.
Response to Office Action U.S. Appl. No. 11/899,790, filed Mar. 8, 2012.
Office Action U.S. Appl. No. 12/862,640, mailed Mar. 9, 2012.
Office Action U.S. Appl. No. 12/287,764, mailed Jan. 13, 2011.
Response to Office Action U.S. Appl. No. 12/287,764, filed May 5, 2011.
Office Action from U.S. Appl. No. 12/842,639, dated Aug. 6, 2014.
Office Action from U.S. Appl. No. 12/506,989, dated Aug. 8, 2014.
Office Action from U.S. Appl. No. 13/017,845, dated Sep. 11, 2014.
Notice of Final Rejection from Korean Appl. No. 10-2009-7017407. dated Feb, 27. 2015.
Notice of Allowance from Taiwanese Appl. No. 096143968, dated Mar. 10, 2015.
Office Action from U.S. Appl. No. 12/842,639, dated Mar. 17, 2015.

\* cited by examiner

MOLDED CHIP FABRICATION METHOD AND APPARATUS

This application is a continuation of, and claims the benefit of, U.S. patent application Ser. No. 10/666,399, filed on Sep. 18, 2003 now U.S. Pat. No. 7,915,085.

BACKGROUND OF THE INVENTION

1. Field of the Invention

This invention relates to coating of semiconductor devices and more particularly to a method and apparatus for coating light emitting diodes (LEDs) with a matrix material containing one or more light conversion materials.

2. Description of the Related Art

LEDs are solid-state devices that convert electric energy to light and they generally comprise an active layer of semiconductor material sandwiched between two oppositely doped layers. When a bias is applied across the doped layers, holes and electrons are injected into the active layer where they recombine to generate light that is emitted omnidirectionally from the active layer and from all surfaces of the LED. Recent advances in LEDs (such as Group III nitride based LEDs) have resulted in highly efficient light sources that surpass the efficiency of filament-based light sources, providing light with equal or greater brightness in relation to input power.

One disadvantage of conventional LEDs used for lighting applications is that they cannot generate white light from their active layers. One way to produce white light from conventional LEDs is to combine different wavelengths of light from different LEDs. For example, white light can be produced by combining the light from red, green and blue emitting LEDs, or combining the light from blue and yellow LEDs.

One disadvantage of this approach is that it requires the use of multiple LEDs to produce a single color of light, increasing the overall cost and complexity. The different colors of light are also generated from different types of LEDs fabricated from different material systems. Combining different LED types to form a white lamp can require costly fabrication techniques and can require complex control circuitry since each device may have different electrical requirements and may behave differently under varied operating conditions (e.g. with temperature, current or time).

More recently, the light from a single blue emitting LED has been converted to white light by coating the LED with a yellow phosphor, polymer or dye, with a typical phosphor being cerium-doped yttrium aluminum garnet (Ce:YAG). [See Nichia Corp. white LED, Part No. NSPW300BS, NSPW312BS, etc.; See also U.S. Pat. No. 5,959,316 to Hayden, "Multiple Encapsulation of Phosphor-LED Devices"]. The surrounding phosphor material "downconverts" the wavelength of some of the LED's blue light, changing its color to yellow. For example, if a nitride-based blue emitting LED is surrounded by a yellow phosphor, some of the blue light passes through the phosphor without being changed while a substantial portion of the light is downconverted to yellow. The LED emits both blue and yellow light, which combine to provide a white light.

One conventional method for coating an LED with a phosphor layer utilizes a syringe or nozzle for injecting a phosphor containing epoxy over the LED. One disadvantage of this method is that it is often difficult to control the phosphor layer's geometry and thickness. As a result, light emitting from the LED at different angles can pass through different amounts of conversion material, which can result in an LED with non-uniform color temperature as a function of viewing angle. Another disadvantage of the syringe method is that because the geometry and thickness is hard to control, it is difficult to consistently reproduce LEDs with the same or similar emission characteristics.

Another conventional method for coating an LED is by stencil printing, which is described in European Patent Application EP 1198016 A2 to Lowery. Multiple light emitting semiconductor devices are arranged on a substrate with a desired distance between adjacent LEDs. The stencil is provided having openings that align with the LEDs, with the holes being slightly larger than the LEDs and the stencil being thicker than the LEDs. A stencil is positioned on the substrate with each of the LEDs located within a respective opening in the stencil. A composition is then deposited in the stencil openings, covering the LEDs, with a typical composition being a phosphor in a silicone polymer that can be cured by heat or light. After the holes are filled, the stencil is removed from the substrate and the stenciling composition is cured to a solid state.

One disadvantage of this method is that, like the syringe method above, it can be difficult to control the geometry and layer thickness of the phosphor containing polymer. The stenciling composition may not fully fill the stencil opening such that the resulting layer is not uniform. The phosphor containing composition can also stick to the stencil opening which reduces the amount of composition remaining on the LED. These problems can result in LEDs having non-uniform color temperature and LEDs that are difficult to consistently reproduce with the same or similar emission characteristics.

Another conventional method for coating LEDs with a phosphor utilizes electrophoretic deposition. The conversion material particles are suspended in an electrolyte based solution. A plurality of LEDs are arranged on a conductive substrate that is then almost completely immersed in the electrolyte solution. One electrode from a power source is coupled to the conductive substrate at a location that is not immersed in the solution, and the other electrode is arranged in the electrolyte solution. The bias from the power source is applied across the electrodes, which causes current to pass through the solution to the substrate and its LEDs. This creates an electric field that causes the conversion material to be drawn to the LEDs, covering the LEDs with the conversion material.

One of the disadvantages of this method is that after the LEDs are covered by the conversion material, the substrate is removed from the electrolyte solution so that LEDs and their conversion material can be covered by a protective epoxy. This adds an additional step to the process and the conversion material (phosphor particles) can be disturbed prior to the application of the epoxy. Another disadvantage of this process is that the electric field in the electrolyte solution can vary such that different concentrations of conversion material can be deposited across the LEDs. The conversion particles can also settle in the solution which can also result in different conversion material concentrations across the LEDs. The electrolyte solution can be stirred to prevent settling, but this presents the danger of disturbing the particles already on the LEDs.

SUMMARY OF THE INVENTION

The present invention seeks to provide a method and apparatus for coating semiconductor devices wherein the geometry and thickness of the coating layer can be controlled. The methods and apparatus according to the present invention are particularly adapted to coating light emitting diodes (LEDs) with a controlled layer of "matrix material" having conversion particles. The methods and apparatus are simple and easy to use, and allow for the reproduction of coated semiconductor devices having coating layer geometry and thickness that are substantially the same.

One embodiment of a method for coating a plurality of semiconductor devices according to the present invention comprises providing a mold with a formation cavity. A plurality of semiconductor devices are mounted within the mold formation cavity and a coating material is injected into the mold to fill the mold formation cavity and at least partially cover the semiconductor devices. The coating material is cured or otherwise treated so that the semiconductor devices are at least partially embedded in the coating material. The cured coating material with the embedded semiconductor devices is removed from the formation cavity. The semiconductor devices are separated so that each is at least partially covered by a layer of the coating material.

Another embodiment of a method according to the present invention is particularly adapted to coating a plurality of light emitting diodes (LEDs) and comprises providing a mold with a formation cavity. A plurality of LEDs are mounted within the mold formation cavity and a matrix material is injected or otherwise introduced into the mold to fill the formation cavity and at least partially cover the LEDs. The matrix material is then cured or otherwise treated so that the LEDs are at least partially embedded in the matrix material. The matrix material with the embedded LEDs is removed from the formation cavity and the embedded LEDs are separated so that each is at least partially covered by a layer of the matrix material.

One embodiment of an apparatus for coating a plurality of semiconductor devices comprises a mold housing having a formation cavity arranged to hold semiconductor devices. The formation cavity is also arranged so that a coating material can be injected or otherwise introduced into and fills the formation cavity to at least partially cover the semiconductor devices.

Another embodiment of apparatus according to the present invention is particularly adapted to coating LEDs and comprises a mold housing having a formation cavity arranged to hold a plurality of LEDs. The formation cavity comprising at least a top and bottom surface with the LEDs arranged on the bottom or top surface. The mold housing is also arranged so that a matrix material can be injected into its formation cavity covering the LEDs and filling the formation cavity.

After the coated LEDs are separated according to the present invention, a bias can be applied to each causing light to be emitted omnidirectionally. LED light passes through the layer of matrix material where at least some of it is converted to a different wavelength of light by the conversion particles. The arrangement of the formation cavity and the location of cuts between adjacent LEDs allows for the geometry and thickness of the layer of matrix material on each of the separated LEDs to be controlled such that the light emitting from the LED at different points on its surface passes through essentially the same amount of conversion material. This results in an LED with a more uniform color temperature as a function of viewing angle.

These and other further features and advantages of the invention will be apparent to those skilled in the art from the following detailed description, taken together with the accompanying drawings, in which:

DETAILED DESCRIPTION OF THE INVENTION

Coating Methods

Figure 1:
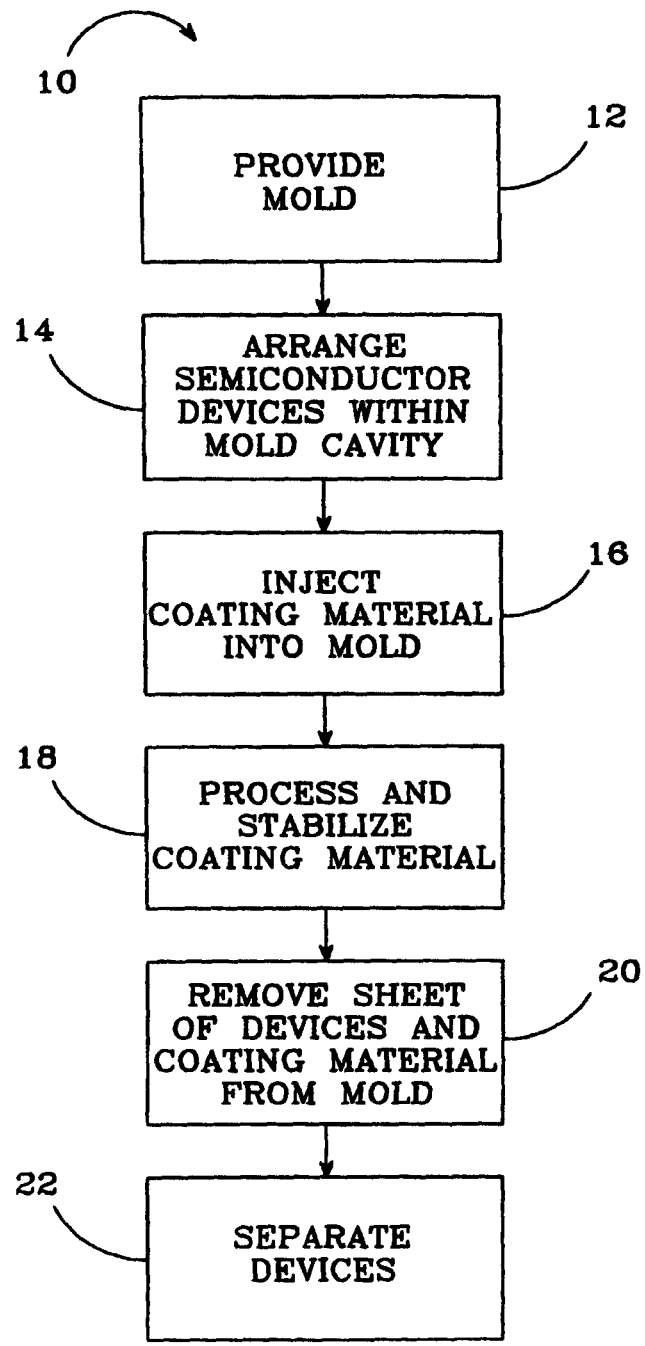
FIG. 1 is a flow diagram of one embodiment of a method for coating semiconductor devices according to the present invention.

FIG. 1 shows one embodiment of a method 10 for coating semiconductor devices according to the present invention and comprises a first step 12 of providing a mold. A preferred mold comprises a formation cavity that is arranged so that semiconductor devices can be held within it and a coating material can be injected or otherwise introduced into it to cover the devices. The cavity can have many different shapes and is preferably defined by at least upper and lower parallel surfaces. In other embodiments the cavity can be further defined by side surfaces running between the upper and lower surfaces. The different shapes of the formation cavity including, but are not limited to, disk, box or lens shaped. The side surfaces can run around the entire edge of the upper and lower surfaces or can be intermittent.

In step 14, semiconductor devices are arranged within the formation cavity and in the preferred method 10, the devices are precisely arranged in a predetermined pattern. The devices can be arranged in many different ways within the formation cavity using many different methods. In a preferred arrangement method the devices are placed on the lower surface by separating the upper surface from the lower and placing the devices using a precision pick and place system. Alternatively, the devices can be placed on the lower surface using a template such as a thin metal foil having a size and shape similar to the lower surface and openings corresponding to desired locations of the semiconductor devices. The foil can be placed on the lower surface and the semiconductor devices can be arranged within the foil openings. After the devices are placed, the foil can be removed. In both methods the upper surface can then be returned over the lower surface after the devices are placed. As further described below, the lateral space between adjacent devices and the space between the upper and lower surfaces provides the desired coating thickness over the semiconductor devices.

In step 16 a coating material is injected or otherwise introduced into the mold's formation cavity, filling the cavity and covering the semiconductor devices. In step 18 the coating material is processed and stabilized resulting in the hardening of the coating material and the semiconductors becoming at least partially embedded in the coating material. A sheet of semiconductor devices and coating material is formed. In a preferred method 10, the coating material is as an epoxy, silicone or other polymer and the preferred processing and stabilizing step 18 includes curing using conventional methods dictated by the coating material's curing schedule. This can include heat curing, optical curing or curing in room temperature. Alternatively, the matrix or coating material may comprise any variety of thermoset, thermoplast, injection molding, or other polymers or related materials.

In step 20, the sheet of semiconductor devices and coating material is removed from the mold's formation cavity for further processing. In step 22 the individual semiconductor devices are separated by cutting through the coating material between devices. This can be accomplished using many different methods such as conventional sawing or dicing, or by using a scribe and break.

As described above, in the preferred step 14 the semiconductor devices are placed on the lower surface with a uniform lateral distance between adjacent devices. The upper and lower surfaces of the formation cavity are also preferably parallel. If similar semiconductor devices having the same height are placed on the lower surface of the formation cavity, the distance between the top of each of the devices and the upper surface should be the same. This results in the thickness of the layer of coating material on the top of each of the devices that is substantially the same. When the devices are separated, the cut is preferably located such that the resulting layer covering the sides of each of the devices has the same thickness. In one embodiment of a method according to the present invention, the cut is equal distance between adjacent devices. This process produces devices that have a nearly uniform layer of coating material and the process can be repeated to produce similar devices. In other embodiments different types of cuts can be made at different angles to change the coating material thickness at different locations over the semiconductor devices.

The method 10 can be used to coat many different types of semiconductor devices, with a preferred device being a solid state light emitter such as a light emitting diode (LED). The preferred coating material in the method for covering LEDs is a "matrix material" that comprises a curable material and one or more light conversion materials (further described below).

Figure 2:
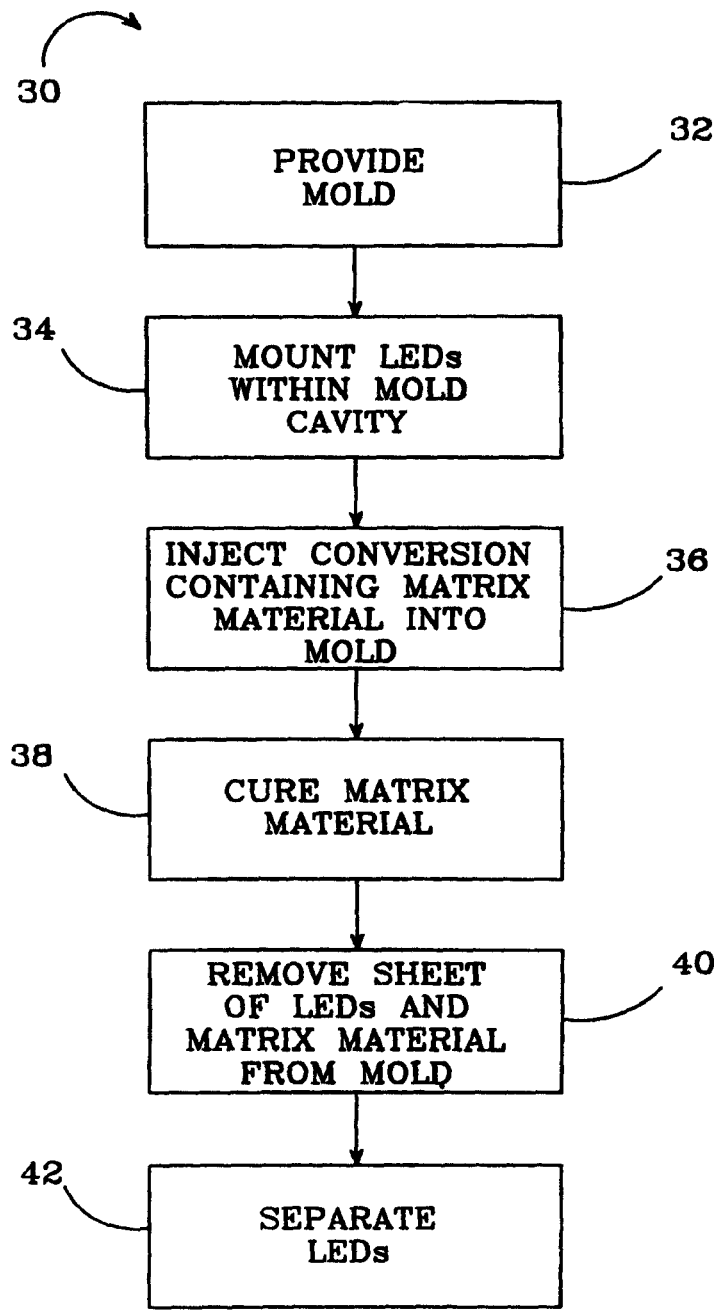
FIG. 2 is a flow diagram of another embodiment of a method for coating semiconductor devices according to the present invention that is particularly adapted to coating light emitting diodes (LEDs)

FIG. 2 shows a flow diagram for a method 30 according to the present invention that is similar to the method 10, but is used to coat a plurality of LEDs. In step 32 a mold is provided having a formation cavity having at least upper and lower surfaces that are parallel, although the formation cavity can have many different shapes. The mold surfaces are preferably flat and comprise a material which does not adhere strongly to matrix materials or the LED during processing steps such as curing. By not adhering the upper and lower surfaces can be removed from the matrix material and LEDs without damage that could result in a non-uniform layer of matrix material over the LEDs. The upper and lower surfaces can be made of by many different materials and can be provided by sheet metal or glass slides.

To further reduce the danger that the upper and lower surfaces would adhere to the matrix material or LEDs, the surfaces of the formation cavity can also be covered with a coating or film layer that resists adhering to the matrix material and can also withstand heat from processing and curing. The film should be tacky enough on both sides to stick to glass or metal that forms the upper and lower surfaces and to stick to semiconductor materials that form the LEDs. The film should not bond to these materials or the matrix material which allows the semiconductor devices and cured matrix material to be easily separated from the mold surfaces without damage. Many different films can be used with a preferred film being a commercially available tape referred to as Gel-Pak®, provided by Gel-Pak, LLC.

In step 34 the LEDs are placed in a predefined array or pattern within the mold's formation cavity and in a preferred embodiment the film layer is arranged between the LEDs and the cavity's surface. The LEDs are preferably arranged on the lower surface of the formation cavity and can be placed using the same methods as used in step 14 of the method 10 described above.

It is desirable to have sufficient adhesion between the LEDs and the surface of the formation cavity such that underflow of the matrix materials is avoided between the LEDs and surface. Lateral LEDs have contacts on one surface and this surface is typically adjacent to a formation cavity surface (or film layer). Vertical LEDs typically have contacts on opposite surfaces, both of which can be adjacent to a formation cavity surface. It is desirable to avoid matrix material underflow that can cover the contacts so that after processing the LED can be electrically contacted. If underflow occurs, the matrix material must be removed from the contact surface, typically by etching, which can damage the LED and the contacts. One method to improve adhesion and reduce underflow is to apply a small amount of low tack adhesive such as silicone between the LED and the mold surface or film. This additional layer prevents underflow and can also serve as surface protection for the contacts during heat processing steps such as curing. Silicone can be removed by using convention cleaning processes that do not damage the LED or contacts.

In step 36 the matrix material is injected or otherwise introduced into and fills the mold's cavity, covering the LEDs. The matrix material can be made of many different compounds but preferably contains one or more light sensitive conversion materials such as phosphors distributed in an epoxy or silicone binder that can be thermally or optically curable, or cured at room temperature. To achieve uniform LED light emission, the conversion material should be distributed uniformly throughout the epoxy or silicone. For embodiments where it is desirable to emit non-uniform light, the conversion material can be non-uniform in the matrix material such that LED light emitting at different angles passes through different amounts of matrix material. Alternatively, the matrix material may exhibit or contain materials which exhibit a variety of useful properties such as high index of refraction to increase light extraction from the LED.

The following is a list of only some of the phosphors and that can be used alone or in combination as the conversion material, grouped by the re-emitted color that each emits following excitation.

Red
$Y_2O_2S:Eu^{3+}, Bi^{3+}$
$YVO4:Eu^{3+}, Bi^{3+}$
$SrS:Eu^{2+}$
$SrY_2S_4:Eu^{2+}$
$CaLa_2S_4:Ce^{3+}$
$(Ca,Sr)S:Eu^{2+}$
$Y_2O_3:Eu^{3+}, Bi^{3+}$
$Lu_2O_3:Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$Sr_2CeO_4$
$SrTiO_3:Pr^{3+}, Ga^{3+}$
Orange
$SrSiO_3:Eu, Bi$
Yellow/Green
$YBO_3:Ce^{3+}, Tb^{3+}$
$BaMgAl_{10}O_{17}:Eu^{2+}, Mn^{2+}$
$(Sr,Ca,Ba)(Al,Ga)_2S_4:Eu^{2+}$
$ZnS:Cu^+, Al^{3+}$
$LaPO_4:Ce, Tb$
$Ca,Mg(SiO_4)_4Cl_2:Eu^{2+}, Mn^{2+}$
$((Gd,Y,Lu,Se,La,Sm)_3(Al,Ga,In)_5O_{12}:Ce^{3+}$
$((Gd,Y)_{1-x}Sm_x)_3(Al_{1-y}Ga_y)_5O_{12}:Ce^{3+}$
$(Y_{1-p-q-r}Gd_pCe_qSm_r)_3(Al_{1-y}Ga_y)_5O_{12}$
$Y_3(Al_{1-s}Ga_s)_5O_{12}:Ce^{3+}$
$(Y,Ga,La)_3Al_5O_{12}:Ce^{3+}$
$Gd_3In_5O_{12}:Ce^{3+}$
$(Gd,Y)_3Al_5O_{12}:Ce^{3+}, Pr^{3+}$
$Ba_2(Mg,Zn)Si_2O_7:Eu^{2+}$
$(Y,Ca,Sr)_3(Al,Ga,Si)_5(O,S)_{12}$
$Gd_{0.46}Sr_{0.31}Al_{1.23}O_xF_{1.38}:Eu^{2+}_{0.06}$
$(Ba_{1-x-y}Sr_xCa_y)SiO_4:Eu$
$Ba_2SiO_4:Eu^{2+}$
Blue
$ZnS:Ag, Al$
Combined Yellow/Red
$Y_3Al_5O_{12}:Ce^{3+}, Pr^{3+}$
White
$SrS:Eu^{2+}, Ce^{3+}, K^+$ It should be understood that many other phosphors and other materials can be used as the conversion material according to the present invention.

From the list above, the following phosphors are preferred for use as the conversion material based on certain desirable characteristic. Each is excited in the blue and/or UV emission spectrum, provides a desirable peak emission, has efficient light conversion, and has acceptable Stokes shift.

Red
$Lu_2O_3:Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3:Pr^{3+}, Ga^{3+}$

Yellow/Green
$(Sr,Ca,Ba)(Al,Ga)_2S_4:Eu^{2+}$
$Ba_2(Mg,Zn)Si_2O_7:Eu^{2+}$
$Gd_{0.46}Sr_{0.31}Al_{1.23}O_xF_{1.38}:Eu^{2+}_{0.06}$
$(Ba_{1-x-y}Sr_xCa_y)SiO_4:Eu$
$Ba_2SiO_4:Eu^{2+}$ To further improve the uniformity of light emission from the covered LED, the matrix material can also include scattering particles to randomly refract the light as it passes through the matrix material. To effectively scatter light, the diameter of the scattering particles should be approximately one half of the wavelength of the light being scattered. Light from the LEDs pass through the particles and is refracted to mix and spread the light. Preferred scattering particles do not substantially absorb LED light and have a substantially different index of refraction than the material in which it is embedded (for example, epoxy). The scattering particles should have as high of an index of refraction as possible. Suitable scattering particles can be made of titanium oxide ($TiO_2$) which has a high index of refraction (n=2.6 to 2.9). Other elements such as small voids or pores could also be used as to scatter the light.

In step 38, the matrix material is cured such that the LEDs are at least partially embedded in the matrix material. In the embodiment where the formation cavity comprises parallel upper and lower surfaces, LEDs and matrix material form a sheet with the LEDs at least partially embedded in the matrix material. The matrix material is allowed to cure by the material's curing schedule either in room temperature, under light for optical curing, or at an elevated temperature for heat curing. In a preferred embodiment of the method 30, all surfaces of the LEDs are covered except for their bottom surface. In step 40 the sheet of LEDs and matrix material is removed from the molds formation cavity, with one method being separating the upper and lower surfaces of the mold to release the sheet, although many other methods can also be used. In step 42, each LED can be singulated, preferably by separating the LEDs in the sheet into individual devices each of which has a similar thickness of matrix material around it. The methods described under step 20 of method 10 can be used, including sawing or dicing or scribe-and-break.

The mold is designed such that the distance between the formation cavity's upper and lower surfaces and the lateral separation between adjacent LEDs results in the desired uniform matrix material thickness on each of the separated LEDs. This results in coated LEDs that emit uniform color temperature and LEDs that can be consistently reproduced with the same or similar emission characteristics.

As more fully described below, depending on the type of LED being coated, the mold can be arranged differently. For lateral devices, where both the positive and negative terminals are on the same LED surface, the LEDs can be arranged with the contacts adjacent to the cavity's lower surface. Spacers can be included between the upper and lower surfaces to maintain the desired distance between the two such that there is a space between the top of the LEDs and the upper surface of the formation cavity. When the cavity is filled with the matrix material, that top surface of each of the LEDs is covered by a layer of matrix material having a similar thickness.

For LEDs having vertical contact geometry, one contact can be on each LED's top surface and the other contact can be on the LED's bottom surface. The top contact terminal should be protected during injection of the matrix material so that it is not covered by the matrix material. In one embodiment, the cavity's upper surface rests on the top surface contacts of the LEDs, with the contact point between the two preventing the top contacts from being fully covered by the injected matrix material.

For each of the above methods, the mold's formation cavity can be provided without a top surface. In those embodiments the matrix should be applied carefully and in a more controlled fashion to proved the desired thickness for the top layer in lateral LEDs and to prevent covering the top contact surface in vertical LEDs.

Coating Apparatus

Figure 3:
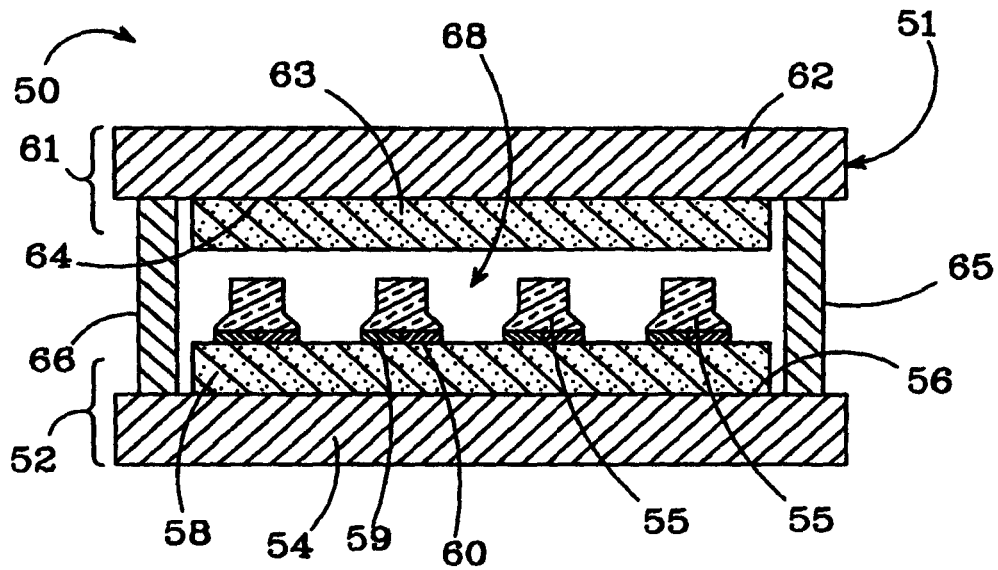
FIG. 3 is a sectional view of one embodiment of a coating apparatus according to the present invention.
Figure 4:
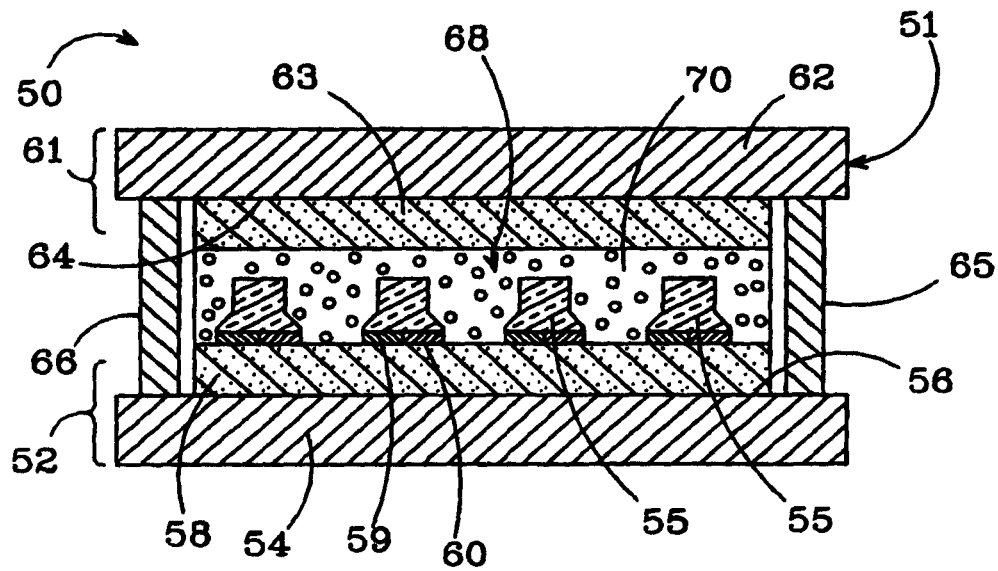
FIG. 4 is a sectional view of the coating apparatus in FIG. 3, with a matrix material injected into the formation cavity.

FIGS. 3 and 4 show one embodiment of a compact coating apparatus 50 according to the present invention that can be used to compact coat many different semiconductor devices, but is particularly adapted to compact coating lateral LEDs with a matrix material. The apparatus 50 includes a mold housing 51 comprising a lower section 52 that includes a bottom rigid support block 54 having LEDs 55 arranged on its top surface. The top surface 56 the bottom support block 54 is preferably flat and the block 54 can be made of many different materials with many different thicknesses. The block material should not adhere to the LED or matrix material during the curing process. Suitable materials include aluminum, glass and stainless steel, and the bottom support block 54 should be thick enough that it does not flex during the layer formation process.

The LEDs 55 can be placed on the support block using the precision placement methods described above. A double sided adhesive film 58 can also be included between the LEDs 55 and the bottom block's flat surface 56. As described above, the film 58 sticks to the block surface 56 and also provides a tacky surface that holds the LEDs 55. The film 58 also withstands processing and curing steps while not adhering to the matrix material, with a suitable material for film 58 being Gel-Pak® (described above in the method 10 of FIG. 1). The film 58 helps to reduce the amount of matrix material that sticks to the surface of the bottom support block 54. In the embodiment shown with lateral LEDs 55, the positive and negative terminals 59, 60 for each of the LEDs 55 are on the surface of each LED that is adjacent to the first film 58 so that when the matrix material is injected into the mold 50, the positive and negative terminals are not covered by the matrix material.

The mold housing 50 also includes an upper section 61 arranged over the lower section 52. The upper section 61 comprises a top rigid support block 62 that provides a flat top surface 64 and can be made of the same material with the same or different thickness as the bottom rigid support block 54. A second layer of adhesive film 63 can also be included on the flat top surface 64 to provide a surface that does resists adhesion to the matrix material, and withstands the processing and curing steps.

The upper section 61 is arranged over the lower section 52 with the space between the two at least partially defining the mold's formation cavity 68. The space between the two should be large enough to provide a space between the top of the LEDs 55 and the second adhesive film 63. Referring to FIG. 4, a matrix material 70 can be injected or otherwise introduced into the formation cavity 68 such that it fills the space between the upper and lower section 52 and 61 and each of the LEDs is covered by the matrix material 70. The positive and negative terminals 59, 60 are protected from being covered by the matrix material and after the individual LEDs are separated (singulated) the terminals 59, 60 are available for contacting.

During the injection of the matrix material 70 and subsequent processing/curing steps, the distance between the lower and upper sections 52 and 61 should be maintained. The lower and upper sections 52 and 61 can have first and second vertical spacers 65, 66 (shown in FIGS. 2 and 4) running between them. The spacers 65, 66 are arranged to maintain the distance between the lower and upper sections 52 and 61 so that the desired matrix material layer thickness is achieved on the top surface of the LEDs 54. The spacers 65, 66 can be arranged in many different ways and can be formed as a single spacer around the edge of the entire formation cavity 68, or multiple spacers can be used.

The inside surfaces of the spacers 65, 66 further define the formation cavity 68 into which the matrix material 70 is injected. The matrix material 70 can be injected or introduced into the cavity 68 by many different methods according to the present invention. One such method comprises removing the upper section 61, injecting the material 70 into the cavity using a syringe, and replacing the upper section 61. Alternatively, the mold 50 can have an access opening through one of its rigid blocks 54, 62 or through one its spacers 65, 66 so that the matrix material 70 can be injected into the cavity without removing either the lower and upper sections 52, 61 or one of the spacers 65, 66. The matrix material 70 can be made of the same material as described in step 36 of the method 30 above and preferably comprises phosphor conversion particles of one or more different type distributed uniformly throughout a curable epoxy, silicone or other polymer.

After the matrix material 70 is injected into the formation cavity 68, the matrix material 70 is cured using a process dictated by the type of epoxy or silicone such as heat curing, light curing or room temperature cooling. After the curing process is complete the matrix material 70 and LEDs 55 form a sheet that can be removed from the mold's formation cavity 68 by removing one or both of the lower and upper sections 52, 61, and/or one or both of the spacers 65, 66.

Figure 5:
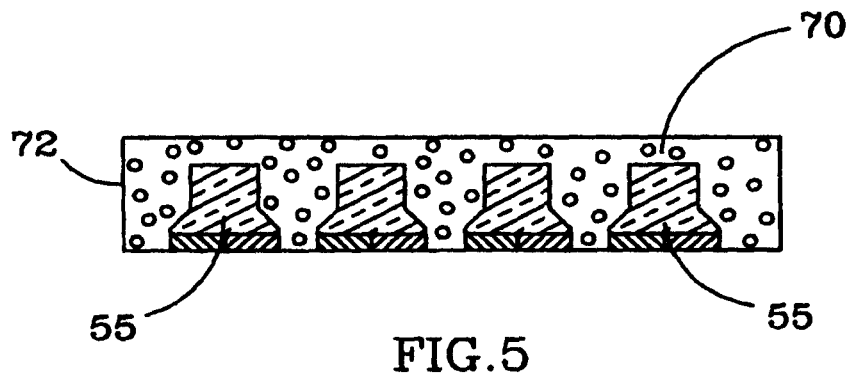
FIG. 5 is a sectional view of a sheet of LEDs and matrix material according to the present invention.

FIG. 5 shows a sheet 72 of matrix material 70 and LEDs 55 after it is removed from the formation cavity 68 of the mold apparatus 50. The sheet can now be separated into individual coated LEDs by sawing, dicing or using a scribe and break.

Figure 6:
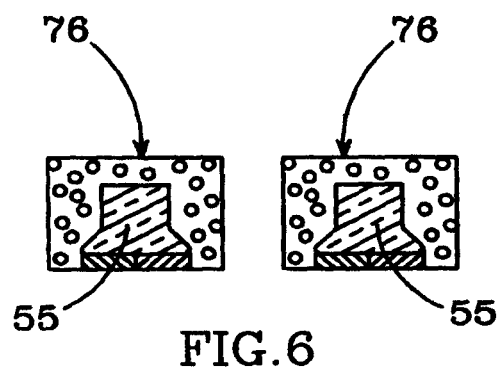
FIG. 6 is a sectional view of one embodiment of two coated LEDs according to the present invention separated from the sheet in FIG. 5.

FIG. 6 shows two coated LEDs 76 separated from the sheet 72 shown in FIG. 5. In the embodiment shown, each of the coated LEDs 76 is separated by making vertical cuts through the matrix material between adjacent LEDs 55. The matrix material can be cut in many different ways such that the layer has different thickness over the LEDs 55 or different LEDs 55 cut from the same sheets can have layers with different thicknesses. The coated LEDs 76 shown in FIG. 6 are cube shaped and the matrix material cut is preferably made at a midpoint between adjacent LEDs 55 so that the side thickness of the matrix material on each coated LED 76 is the same. In other embodiments the cut can be made off midpoint or two cuts can be made, each of which is off midpoint but closer to one of the adjacent LEDs 55 such that the side thickness of the matrix material is still the same for each LED. This type of cubed shaped arrangement is particularly applicable to LEDs that are square, although it can also be used with LEDs having angled surfaces as shown.

Figure 7:
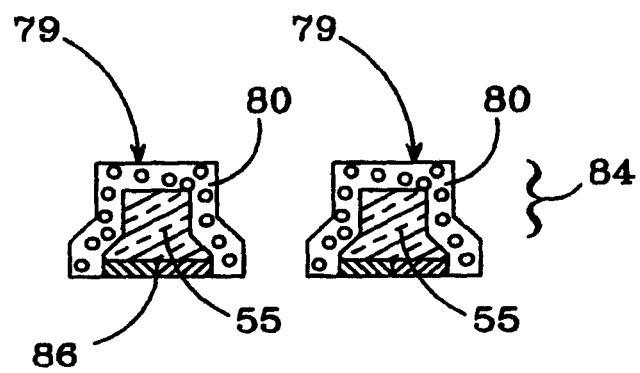
FIG. 7 is a sectional view another embodiment of two coated LEDs according to the present invention separated from the sheet in FIG. 5.
Figure 8:
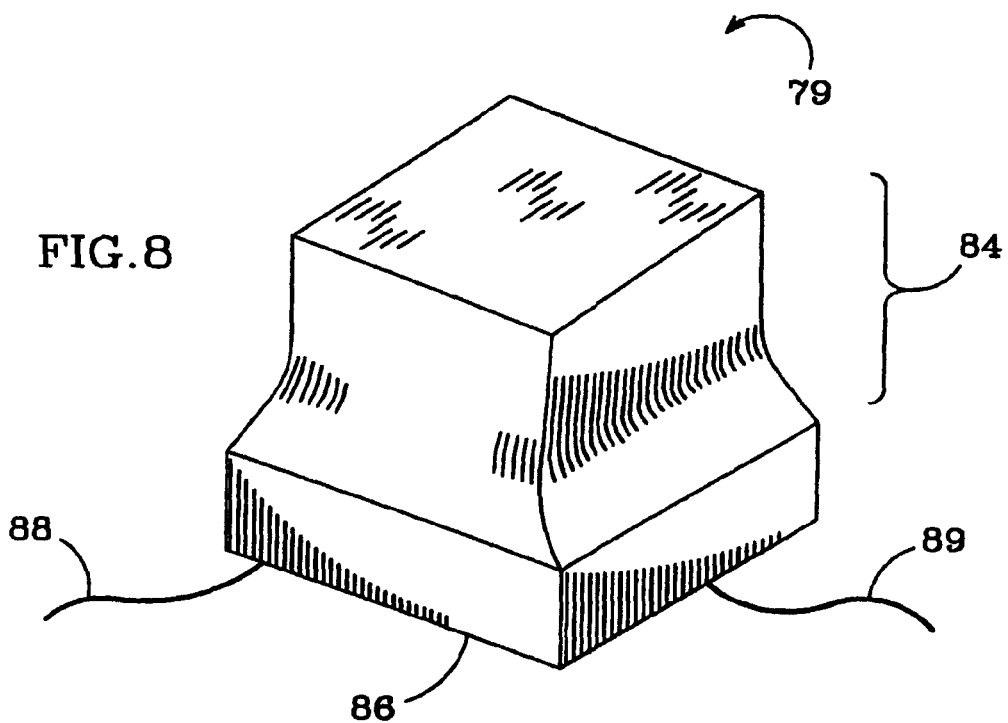
FIG. 8 is a perspective view of one the LEDs shown in FIG. 7.

For different shaped LEDs, the matrix material can also be cut so that the matrix material layer conforms to the shape of the LED. FIGS. 7 and 8 show individually coated angled side surface coated LEDs 79 that have a layer of matrix material 80 that more closely conforms to the shape of each LED 55. Angled side surfaces are typically included to increase the LEDs light extraction. The shape of the matrix layer 80 can be obtained using different methods, with a preferred method being cutting through the matrix material to a depth 84 using a wider sawing (dicing) blade having an angled point. The remainder of the matrix material can then be cut using a standard narrow sawing (dicing) blade. The layer 80 conforms more closely to the shape of the LED such that light emitting from the LED 55 passes through substantially the same amount of matrix material. Accordingly, light emitted from the coated LED 79 is more uniform and total internal reflection is reduced. Each of the coated LEDs 79 have both contacts on the bottom, uncoated surface 86 and FIG. 8 also shows first and second conductors 88, 89 that can be used to apply a bias across the contacts, causing the LED 55 to emit light.

Figure 9:
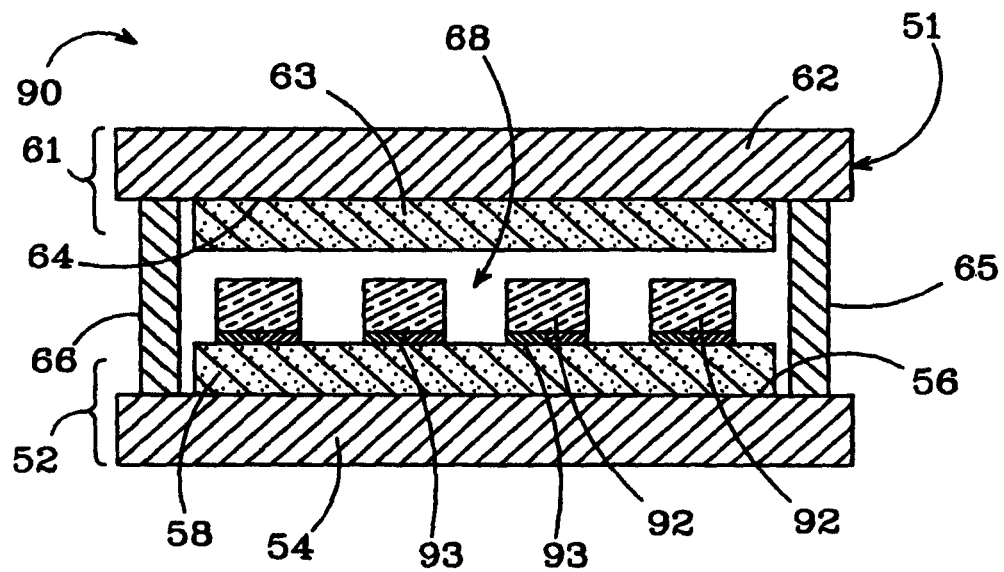
FIG. 9 is a sectional view of another embodiment of a coating apparatus according to the present invention for coating square devices.
Figure 10:
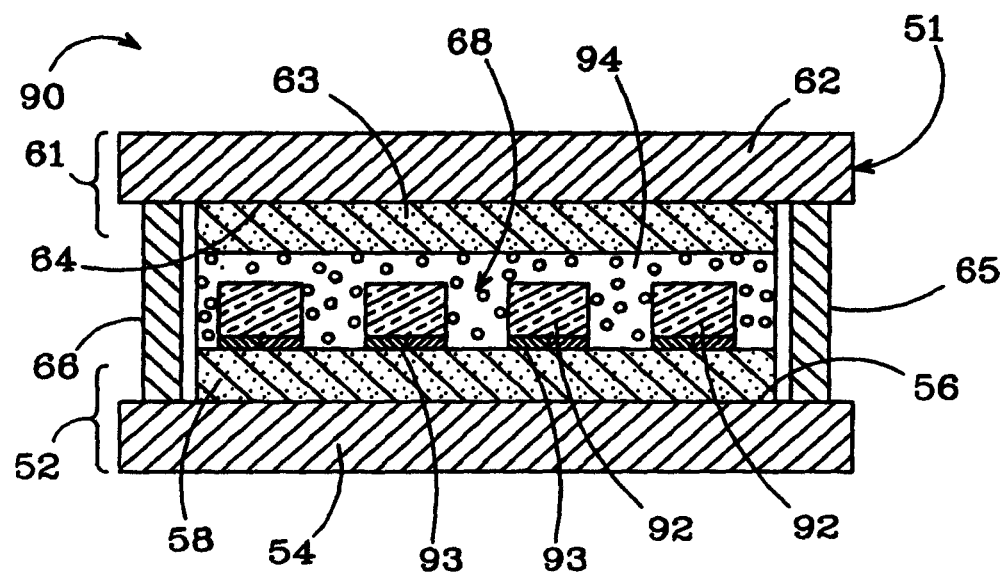
FIG. 10 is a sectional view of the coating apparatus in FIG. 9, with a matrix material injected into the formation cavity.

FIGS. 9 and 10 show another embodiment of a compact coating apparatus 90 according to the present invention that comprises many of the same features as the apparatus 50 shown in FIGS. 3 and 4, with the apparatus 90 used to coat square LEDs 92. The features of the apparatus 90 that are the same as those in the apparatus 50 use the same reference numerals in FIGS. 9 and 10. Accordingly, the reference numerals and many of the corresponding features are not introduced or described again in the referring to FIGS. 9 and 10.

Like the LEDs 55 in FIGS. 3 and 4, the square LEDs 92 are arranged on either the top surface 56 of the support block 54, or in the embodiment shown with a first film 58, on the top surface of the adhesive film 58 such that portions of the film are sandwiched between the LEDs 92 and the support block 54. The LEDs 92 have bottom contacts 93 whose top surface is protected by the block 54 or film 58 from being covered by the matrix material. Referring to FIG. 10, a matrix material 94 can be injected into the formation cavity 68 covering the LEDs 92 and the matrix material 94 can be cured such that the LEDs 92 become embedded in the matrix material 94.

Figure 11:
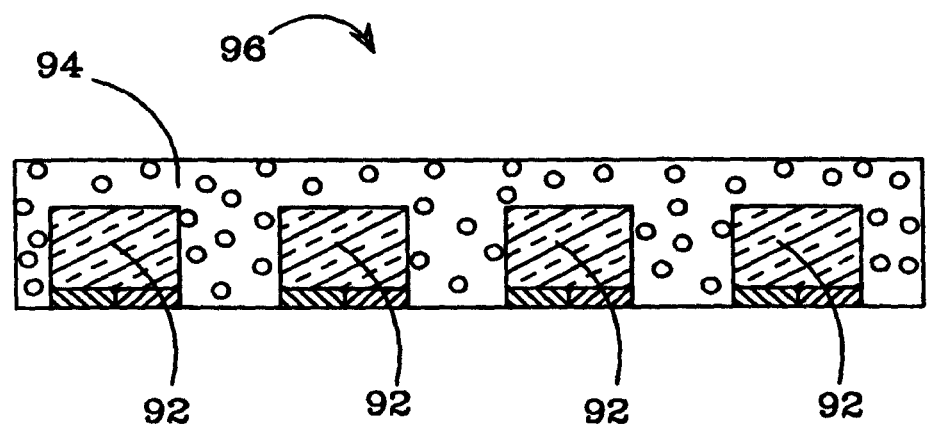
FIG. 11 is a sectional view of a sheet of LEDs and matrix material according to the present invention.
Figure 12:
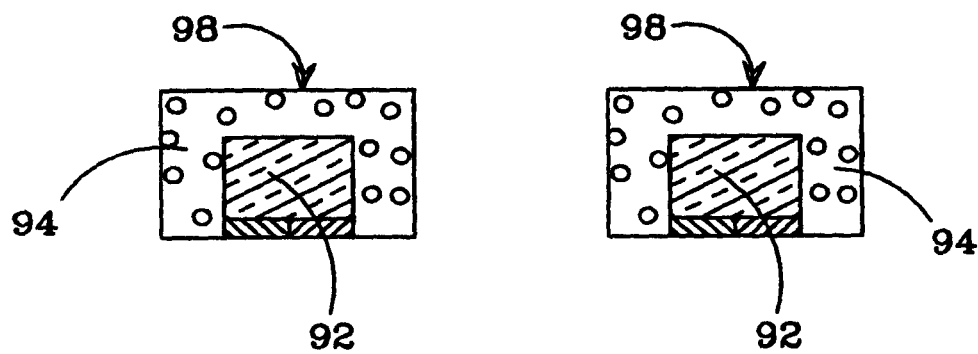
FIG. 12 is a sectional view of one embodiment of two coated LEDs according to the present invention separated from the sheet in FIG. 11.

FIG. 11 shows the sheet 96 of LEDs 92 and matrix material 94 after being removed from the formation cavity by the methods described during the discussion of FIGS. 4 and 5 above. FIG. 12 shows the individual coated LEDs 98 after being separated from the sheet 96 using the separation methods described above, with each of the square LEDs 92 having a nearly uniform layer of matrix material 94 so that the coated LEDs 98 emit similar light.

Figure 13:
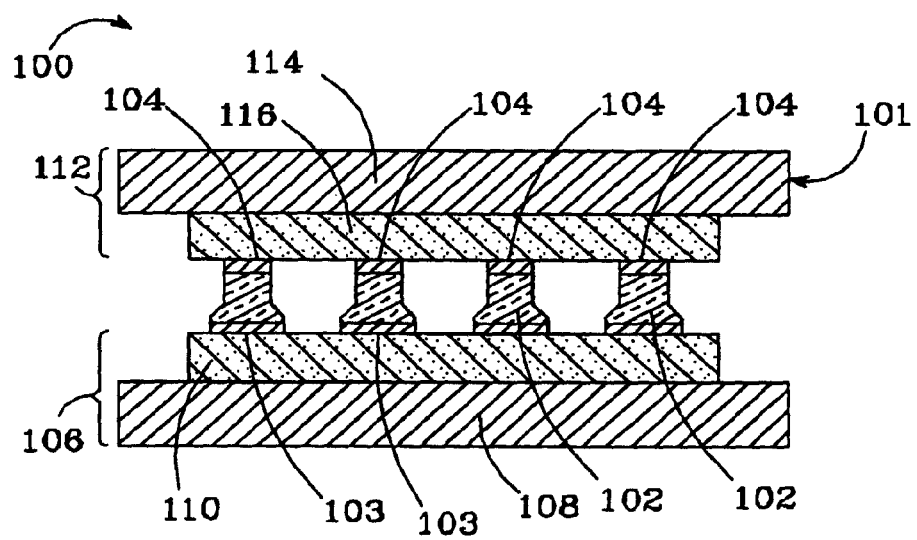
FIG. 13 is a sectional view of another coating apparatus according to the present invention.

FIG. 13 shows another embodiment of a mold apparatus 100 that can also be used to compact coat different semiconductor devices, but is particularly adapted to coating semiconductor devices that have a contact on their top surface. One such device is a vertical LED 102 having a first contact 103 on its bottom surface and a second contact 104 on its top surface. The apparatus 100 comprises a mold housing 101 including a lower section 106 that is similar to the lower section 54 described in FIG. 3, and comprises a bottom support block 108 and a first double sided adhesive film 110 (e.g. Gel-Pak®). Vertical LEDs 102 are arranged on the layer 110 with their first contact 103 adjacent to the layer 110.

The apparatus 100 also comprises an upper section 112 that is similar to the upper section 61 described in FIGS. 3 and 4, and comprises a top rigid block 114 and a second double sided adhesive film 116. However, in apparatus 100 there are no spacers. Instead, the second adhesive film 116 rests on the second contacts 104 of the LEDs 102, which maintains the appropriate distance between the lower and upper sections 106, 112 and also protects the top of the contacts 94 from being covered by the matrix material. If desired, the apparatus 100 can include side surfaces (not shown) to further define the formation cavity 119.

Figure 14:
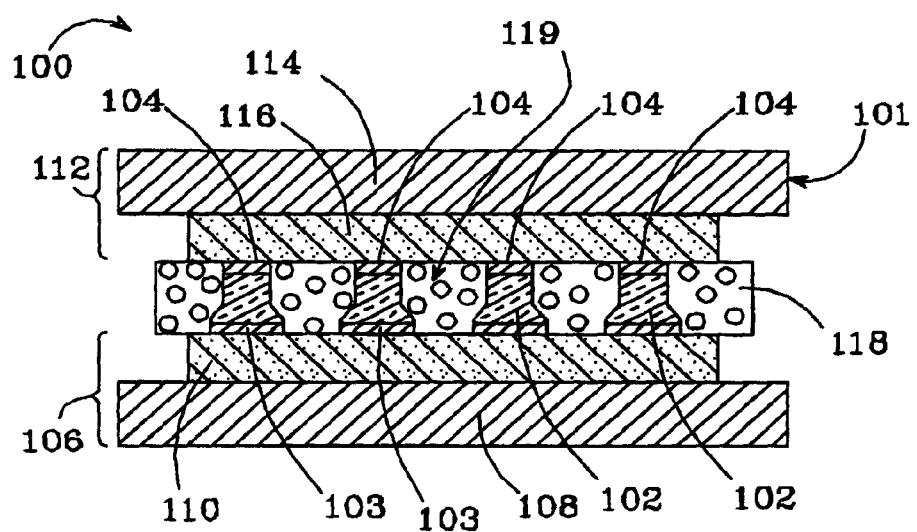
FIG. 14 is a sectional view of the coating apparatus of FIG. 13 with a matrix material injected into the formation cavity.

FIG. 14 shows the apparatus 100 with the matrix material 118 injected or otherwise introduced between the lower and upper sections 106, 112, that at least partially define a formation cavity 119. The matrix material 118 can then be cured using the processes described above, so that the LEDs 102 and matrix material 118 form a sheet 120. The first contact 103 of each LED 102 is protected from being covered by the matrix material 118 by the first adhesive film 110 and second contact 104 is protected from being fully covered by the matrix material by the second adhesive film 116. Accordingly, both the first and second contacts 103, 104 are available for electrical contact without further processing or etching.

Figure 18:
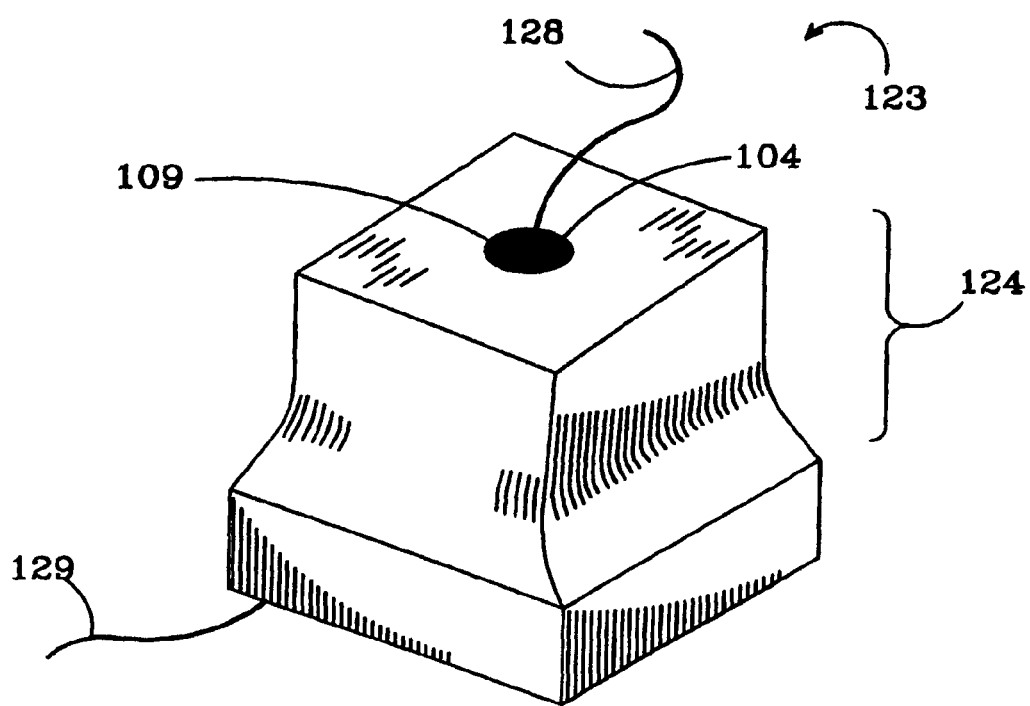
FIG. 18 is a perspective view of one of the LEDs shown in FIG. 13.
Figure 15:
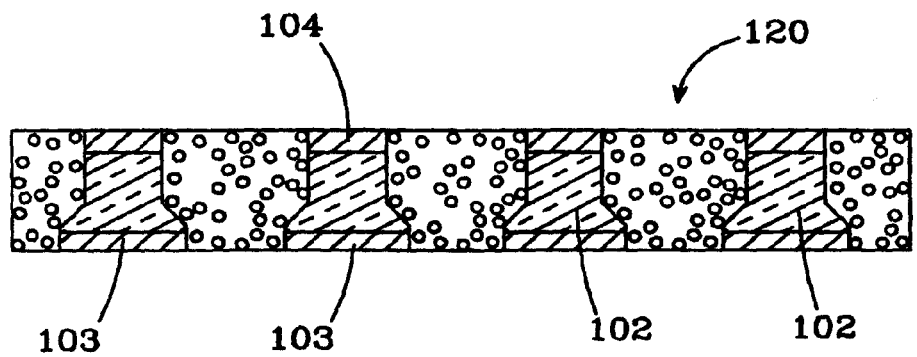
FIG. 15 is a sectional view of a sheet of LEDs and matrix material according to the present invention.
Figure 16:
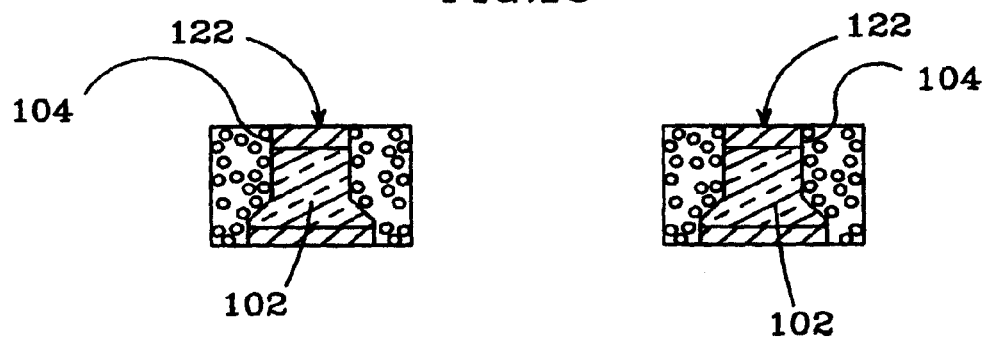
FIG. 16 is a sectional view of one embodiment of two coated LEDs according to the present invention separated from the sheet in FIG. 11.
Figure 17:
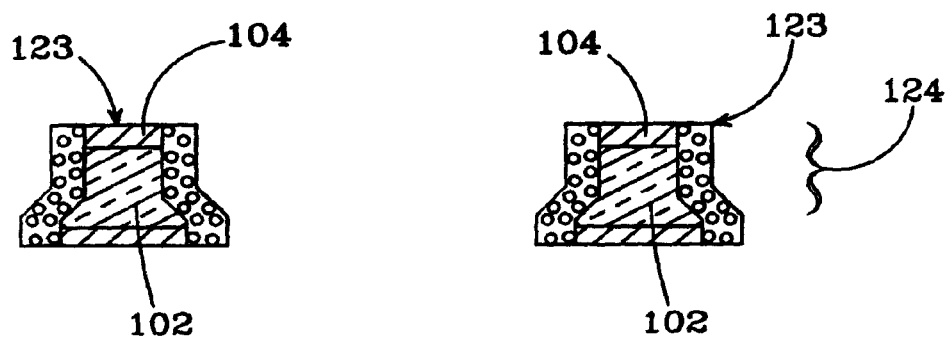
FIG. 17 is a sectional view of another embodiment of two coated LEDs according to the present invention separated from the sheet in FIG. 11.

FIG. 15 shows the sheet 120 after it has been removed from the apparatus 100. FIG. 16 shows individual coated LEDs 122 after they have been separated, with the preferred separation method being vertical cuts through the matrix material between adjacent LEDs 102 to form cube shaped devices. FIGS. 17 and 16 show LEDs 123 after being cut to match the angled sides of the LEDs 92. This can be accomplished using the two cut method described above wherein a wider saw with and angled blade is used to cut the matrix material to a first depth 124 and a standard narrower blade is used to cut through the remainder of the matrix material. FIG. 18 shows the second contact 104 available for contacting with a first conductor 128 coupled to the second contact 104. A bottom conductor 129 is coupled to the LED's first contact 103 (shown in FIG. 17). A bias applied across conductors 128 and 129 causes the coated LED 102 to emit light.

Figure 19:
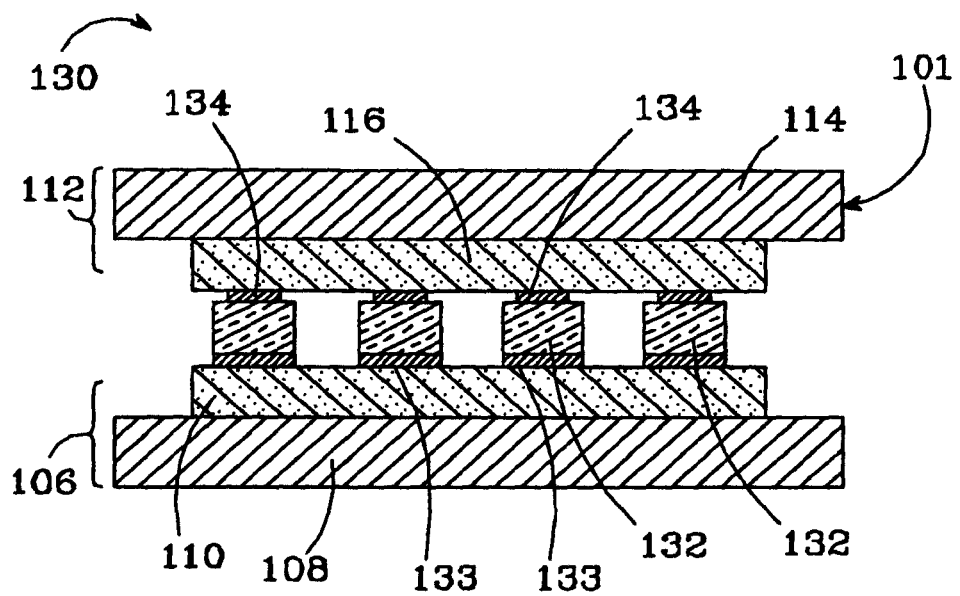
FIG. 19 is a sectional view of another coating apparatus according to the present invention for coating square devices.
Figure 20:
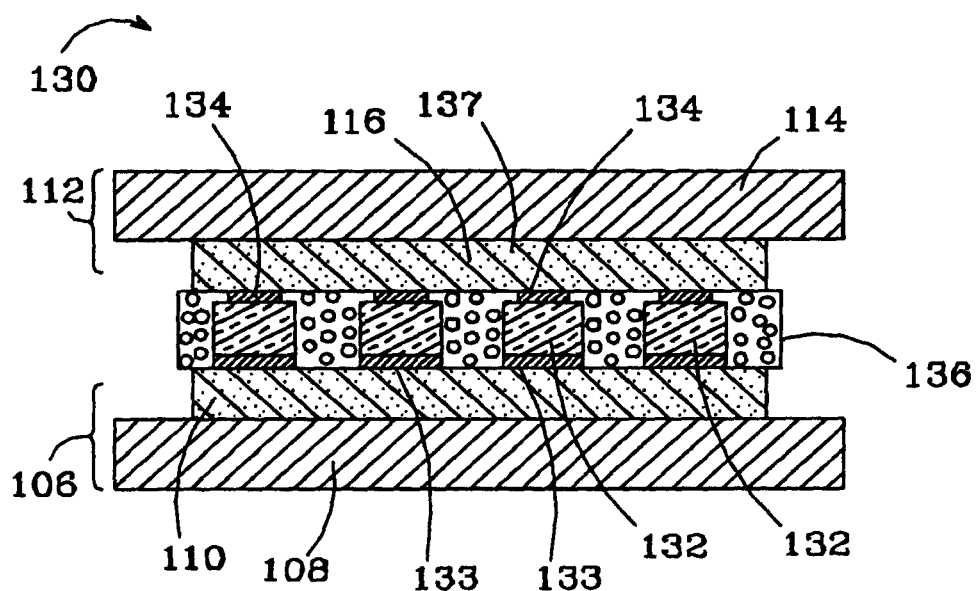
FIG. 20 is a sectional view of the coating apparatus of FIG. 19 with a matrix material injected into the formation cavity.

FIGS. 19 and 20 show another embodiment of a compact coating apparatus 130 according to the present invention that comprises many of the same features as the apparatus 100 shown in FIGS. 13 and 14, with the apparatus 130 used to coat square LEDs 132. The features of the apparatus 130 in FIGS. 19 and 20 that are the same as those in the apparatus 100 in FIGS. 13 and 14 use the same reference numerals for the same features. Accordingly, the reference numerals and many of the corresponding features are not introduced or described again in the referring to FIGS. 19 and 20.

Like the LEDs 102 in FIGS. 13 and 14, the square LEDs 132 have a first contact 133 and a second contact 134 and the LEDs 132 are arranged on either the top surface of the block 108, or in the embodiment shown with a first film 110, on the top surface of the adhesive film 110. Portions of the film 110 are sandwiched between the LEDs 132 and the block 108, with their first contacts 133 protected. The upper section 112 is arranged on the LEDs second contacts 134 such that they are also protected.

Referring to FIG. 20, a matrix material 136 can be injected or otherwise introduced into the formation cavity covering the LEDs 123 and the matrix material 136 can be cured such that the LEDs 132 become embedded in the matrix material 136.

Figure 21:
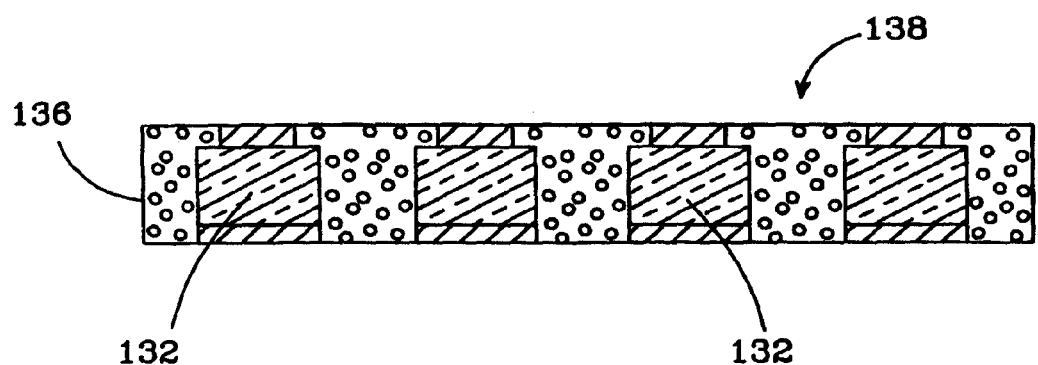
FIG. 21 is a sectional view of a sheet of LEDs and matrix material according to the present invention.
Figure 22:
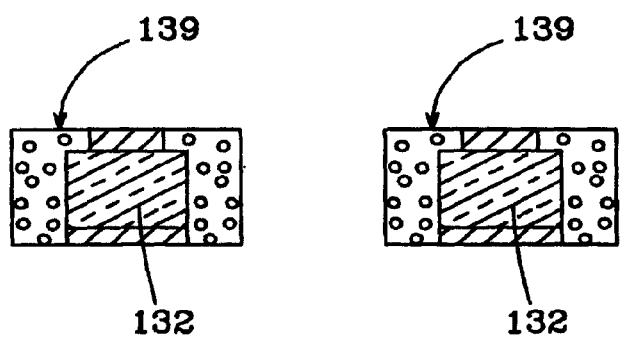
FIG. 22 is a sectional view of one embodiment of two coated LEDs according to the present invention separated from the sheet in FIG. 11.

FIG. 21 shows the sheet 138 of LEDs 132 and matrix material 136 after being removed from the formation cavity by the methods described in the discussion of FIGS. 4 and 5 above. FIG. 22 shows the individual coated LEDs 139 after being separated from the sheet 138 using the methods described above in the discussion of FIGS. 6, 7 and 8. Each of the square LEDs 132 has a similar layer of matrix material 136 so that the LEDs 132 emit similar light.

Each of the apparatus described above can include a small amount of low tack adhesive such as silicone between the LED contacts and the mold surface or film as described in the method 10 of FIG. 1. As described above, this additional layer prevents underflow and can also serve as surface protection for the contacts during heat processing steps such as curing. Silicone can then be removed by using convention cleaning processes that do not damage the LED or contacts.

Although the present invention has been described in considerable detail with reference to certain preferred configurations thereof, other versions are possible. Different curable materials and light conversion particles can be used. The molds can take different shapes, can have different components and the semiconductor devices can be arranged differently in the mold's formation cavity. The individual LEDs can be separated from the sheet using many different sawing or dicing methods, with the cuts being straight or angled through the matrix material. The different coating apparatus described above can be provided without an upper section and in those embodiments the matrix material should be introduced in a careful and controlled manner to provide the desired layer of matrix material. Therefore, the spirit and scope of the appended claims should not be limited to their preferred versions contained therein.

We claim:

1. A light emitting diode (LED), comprising:
a plurality of semiconductor layers comprising an active region between two oppositely doped layers;
positive and negative contacts on the same surface of said semiconductor layers and coplanar with each other, said active region emitting light in response to an electrical signal applied to said contacts; and
a conformal coat of matrix material covering surfaces of said semiconductor layers, with an exposed portion of each of said contacts being uncovered by said matrix material and coplanar with an adjacent surface of said matrix material.

2. The LED of claim 1, wherein said contacts are accessible from the bottom of said semiconductor layers.

3. The LED of claim 1, wherein said matrix material comprises one or more phosphors.

4. The LED of claim 1, wherein said matrix material comprises one or more phosphors distributed in a binder.

5. The LED of claim 1, wherein said active region light passes through said matrix material wherein at least some of said active region light is converted to a different wavelength by said matrix material.

6. The LED of claim 1, wherein said active region light comprises blue or UV light, and said matrix material absorbs at least some of said active region light and re-emits light at a different wavelength.

7. The LED of claim 6, wherein said matrix material re-emits yellow or green light.

8. The LED of claim 1, wherein said semiconductor layers further comprise shaped side surfaces, wherein said matrix material conforms to said shaped side surfaces.

9. The LED of claim 1, wherein said semiconductor layers further comprise top and side surfaces, wherein said matrix material covers at least some of said top and side surfaces.

10. The LED of claim 1, wherein said matrix material further comprises scattering particles.

11. The LED of claim 1, wherein at least some of said active region light passes through said matrix material, said matrix material such that said active region light passes through substantially the same amount of matrix material.

12. A light emitting diode (LED), comprising:
a plurality of semiconductor layers in a lateral geometry;
positive and negative terminals on the same side of said semiconductor layers and coplanar with each other, said semiconductor layers emitting light in response to an electrical signal applied to said terminals; and
a conformal coat of conversion material covering surfaces of said semiconductor layers, said conversion material converting at least some of said semiconductor layer light, with an exposed portion of each of said terminals being uncovered by said conversion material and coplanar with an adjacent surface of said conversion material.

13. The LED of claim 12, wherein at least a portion of said terminals being uncovered by said matrix material.

14. The LED of claim 12, said LED comprising angled side surfaces to increase light extraction.

15. The LED of claim 12, wherein said semiconductor layers have a top and side surfaces covered by said conversion material.

16. The LED of claim 15, wherein said semiconductor layer light passes through substantially the same amount of conversion material.

17. The LED of claim 15, wherein said terminals are accessible from the bottom of said semiconductor layers.

18. The LED of claim 15, wherein said conversion material comprises one or more phosphors distributed in a binder.

19. The LED of claim 18, wherein said conversion material is distributed uniformly in said binder.

20. The LED of claim 18, wherein said conversion material is distributed non-uniformly in said binder.

21. The LED of claim 1, wherein said semiconductor layer light comprises blue or UV light, and conversion material absorbs at least some of said semiconductor layer light and re-emits light at a different wavelength.

22. The LED of claim 6, wherein said conversion material re-emits yellow or green light.

23. A light emitting diode (LED), comprising:
semiconductor layers;
contacts on said semiconductor layers on the same surface of said semiconductor layers and coplanar with each other;
a conversion material as a conformal coat on said semiconductor layers, with an exposed portion of each of said contacts being uncovered by said conversion material and coplanar with an adjacent surface of said conversion material.

24. The LED of claim 23, wherein said semiconductor layers further comprise top and bottom surfaces, conversion material covering at least a portion of said semiconductor layers top and side surfaces.

25. The LED of claim 23, wherein said contacts are accessible from the bottom surface.

26. The LED of claim 23, wherein said semiconductor layers are in a lateral geometry.

* * * * *